US012080593B2

(12) United States Patent
Chen et al.

(10) Patent No.: US 12,080,593 B2
(45) Date of Patent: Sep. 3, 2024

(54) BARRIER-LESS STRUCTURES

(71) Applicant: Taiwan Semiconductor Manufacturing Co., Ltd., Hsinchu (TW)

(72) Inventors: Hsin-Ping Chen, Hsinchu (TW); Ming-Han Lee, Taipei (TW); Shin-Yi Yang, New Taipei (TW); Yung-Hsu Wu, Taipei (TW); Chia-Tien Wu, Taichung (TW); Shau-Lin Shue, Hsinchu (TW); Min Cao, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/859,981

(22) Filed: Jul. 7, 2022

(65) Prior Publication Data

US 2022/0352019 A1     Nov. 3, 2022

Related U.S. Application Data

(62) Division of application No. 16/547,763, filed on Aug. 22, 2019, now abandoned.

(51) Int. Cl.
| H01L 21/768 | (2006.01) |
| H01L 21/321 | (2006.01) |
| H01L 23/522 | (2006.01) |
| H01L 23/528 | (2006.01) |
| H01L 23/532 | (2006.01) |

(52) U.S. Cl.
CPC .. *H01L 21/76846* (2013.01); *H01L 21/76802* (2013.01); *H01L 21/7684* (2013.01); *H01L 21/76844* (2013.01); *H01L 21/76877* (2013.01); *H01L 21/76879* (2013.01); *H01L 23/5226* (2013.01); *H01L 23/5283* (2013.01); *H01L 23/53209* (2013.01); *H01L 23/53252* (2013.01); *H01L 23/53266* (2013.01); *H01L 21/3212* (2013.01)

(58) Field of Classification Search
CPC ......... H01L 21/76844; H01L 21/28562; H01L 23/5226; H01L 21/76897; H01L 21/76849
See application file for complete search history.

(56) References Cited

U.S. PATENT DOCUMENTS

| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |

(Continued)

*Primary Examiner* — Alia Sabur
(74) *Attorney, Agent, or Firm* — HAYNES AND BOONE, LLP

(57) ABSTRACT

Interconnect structures and method of forming the same are disclosed herein. An exemplary interconnect structure includes a first contact feature in a first dielectric layer, a second dielectric layer over the first dielectric layer, a second contact feature over the first contact feature, a barrier layer between the second dielectric layer and the second contact feature, and a liner between the barrier layer and the second contact feature. An interface between the first contact feature and the second contact feature includes the liner but is free of the barrier layer.

20 Claims, 33 Drawing Sheets

(56) References Cited

U.S. PATENT DOCUMENTS

| | | | |
|---|---|---|---|
| 9,236,267 B2 | 1/2016 | De et al. | |
| 9,236,300 B2 | 1/2016 | Liaw | |
| 9,520,482 B1 | 12/2016 | Chang et al. | |
| 9,576,814 B2 | 2/2017 | Wu et al. | |
| 2006/0046456 A1 | 3/2006 | An | |
| 2006/0128142 A1* | 6/2006 | Whelan | B82Y 30/00 |
| | | | 257/E21.171 |
| 2007/0082488 A1* | 4/2007 | Katou | H01L 21/76886 |
| | | | 257/455 |
| 2013/0200525 A1 | 8/2013 | Lee et al. | |
| 2014/0210087 A1 | 7/2014 | Kang | |
| 2014/0327140 A1* | 11/2014 | Zhang | H01L 21/28562 |
| | | | 438/653 |
| 2016/0027738 A1* | 1/2016 | Murray | H01L 21/76802 |
| | | | 438/653 |
| 2016/0163847 A1 | 6/2016 | Tsai et al. | |
| 2017/0047248 A1* | 2/2017 | Rullan | H01L 21/31144 |
| 2017/0053804 A1* | 2/2017 | Lu | H01L 21/76832 |
| 2018/0083002 A1* | 3/2018 | Kim | H01L 21/76825 |
| 2018/0102285 A1* | 4/2018 | Siew | H01L 23/5226 |
| 2018/0151503 A1* | 5/2018 | Kolics | H01L 21/7684 |
| 2019/0043959 A1* | 2/2019 | Lee | H01L 29/6656 |
| 2019/0244896 A1 | 8/2019 | Lee et al. | |
| 2020/0135549 A1* | 4/2020 | Hong | H01L 23/5226 |

\* cited by examiner

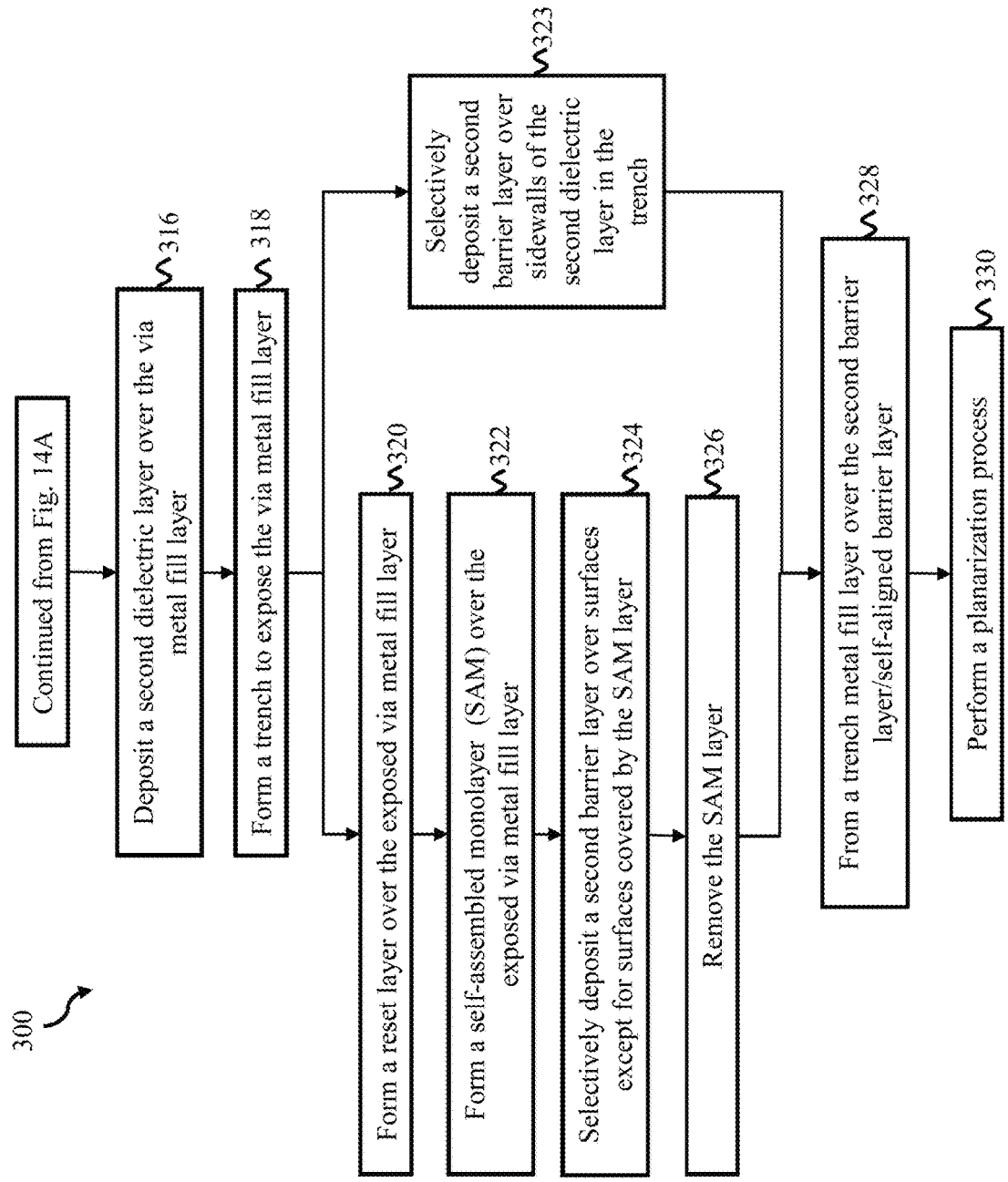

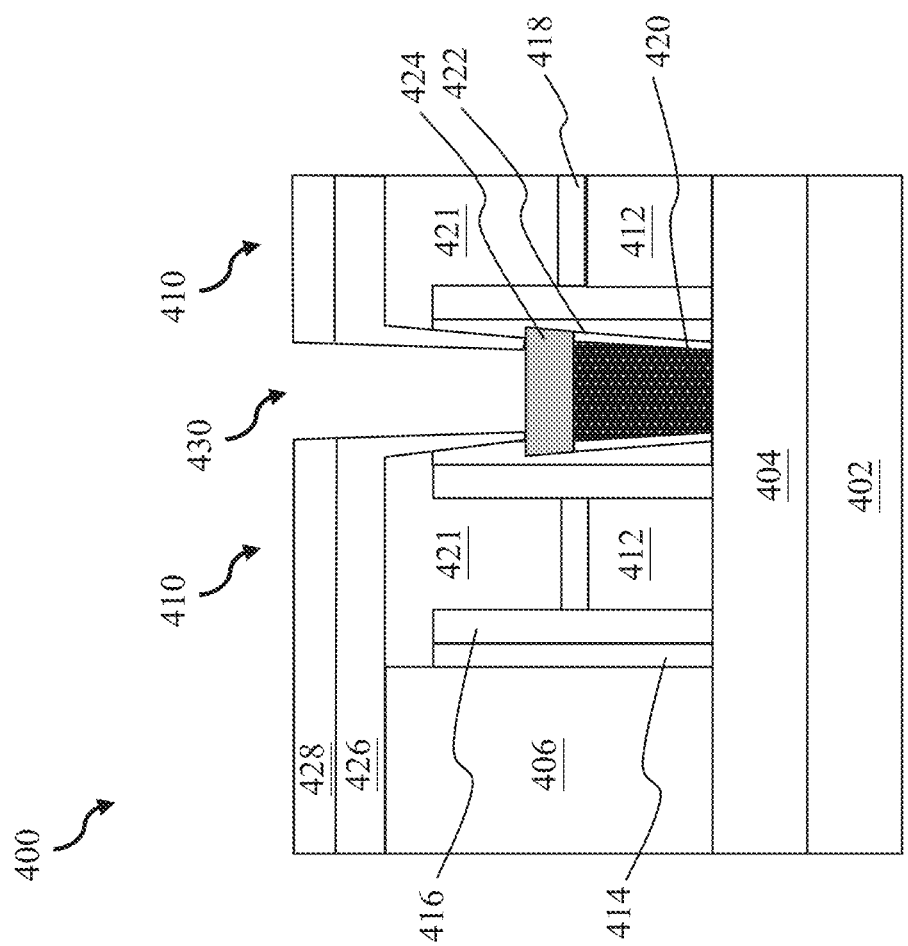

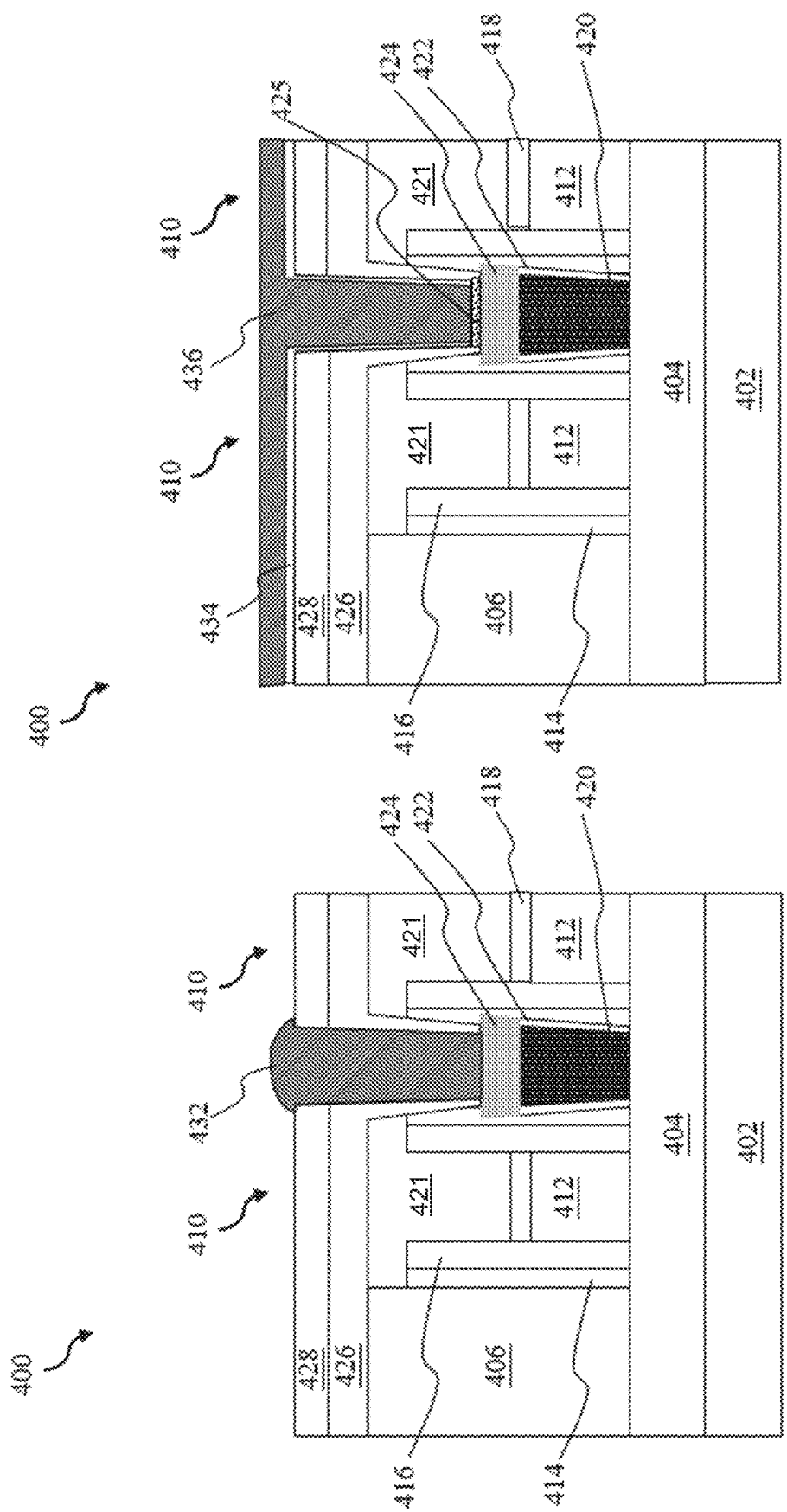

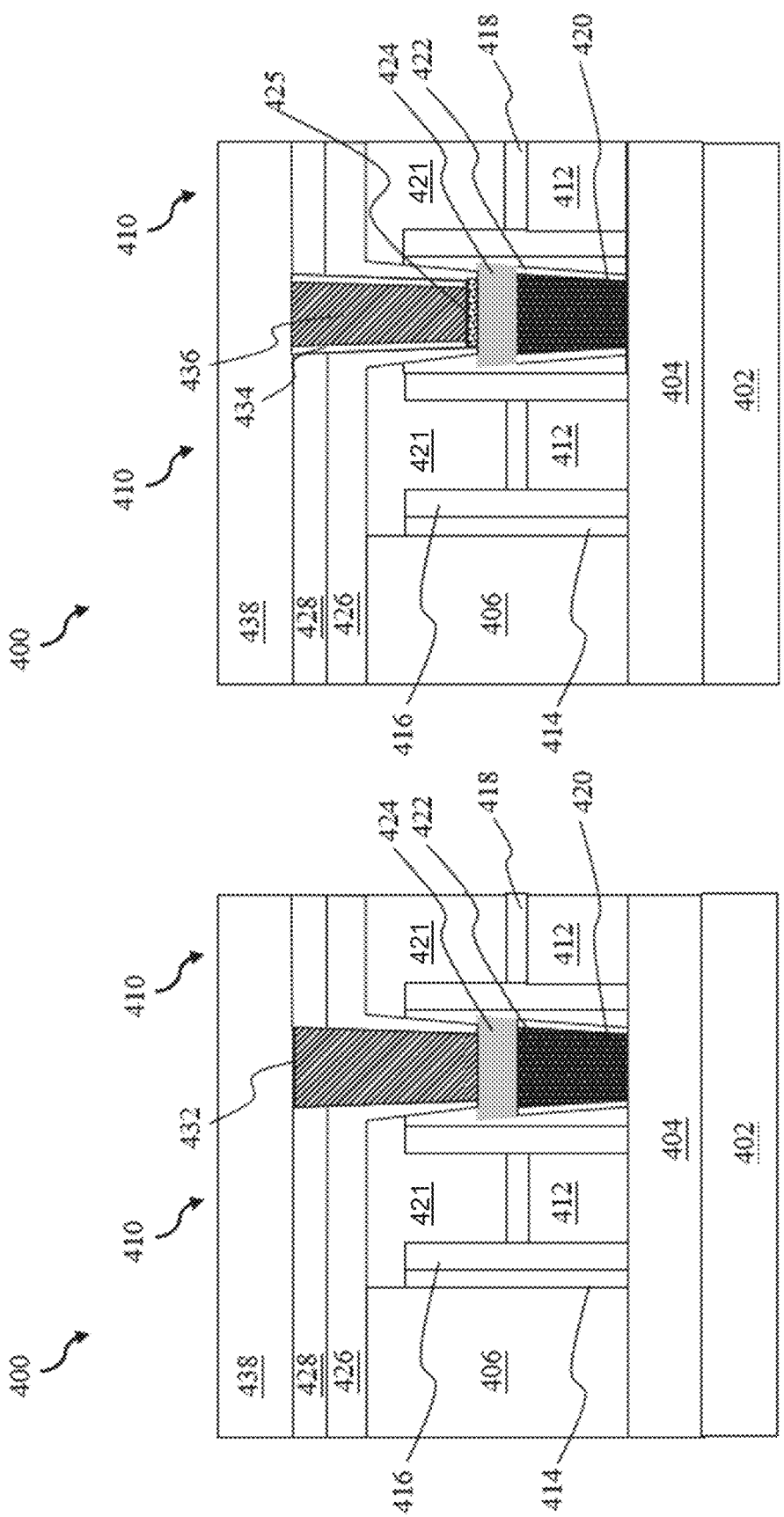

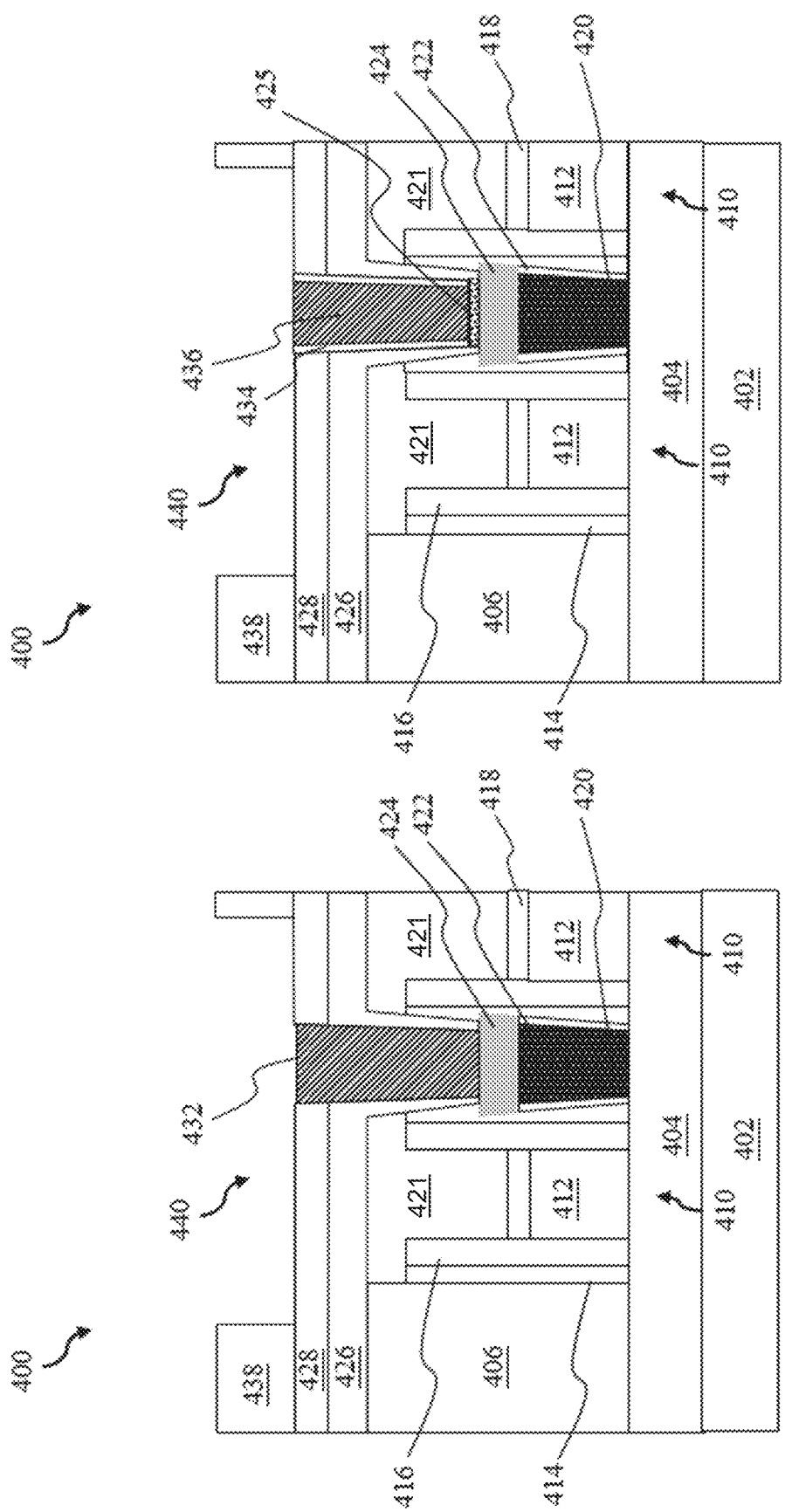

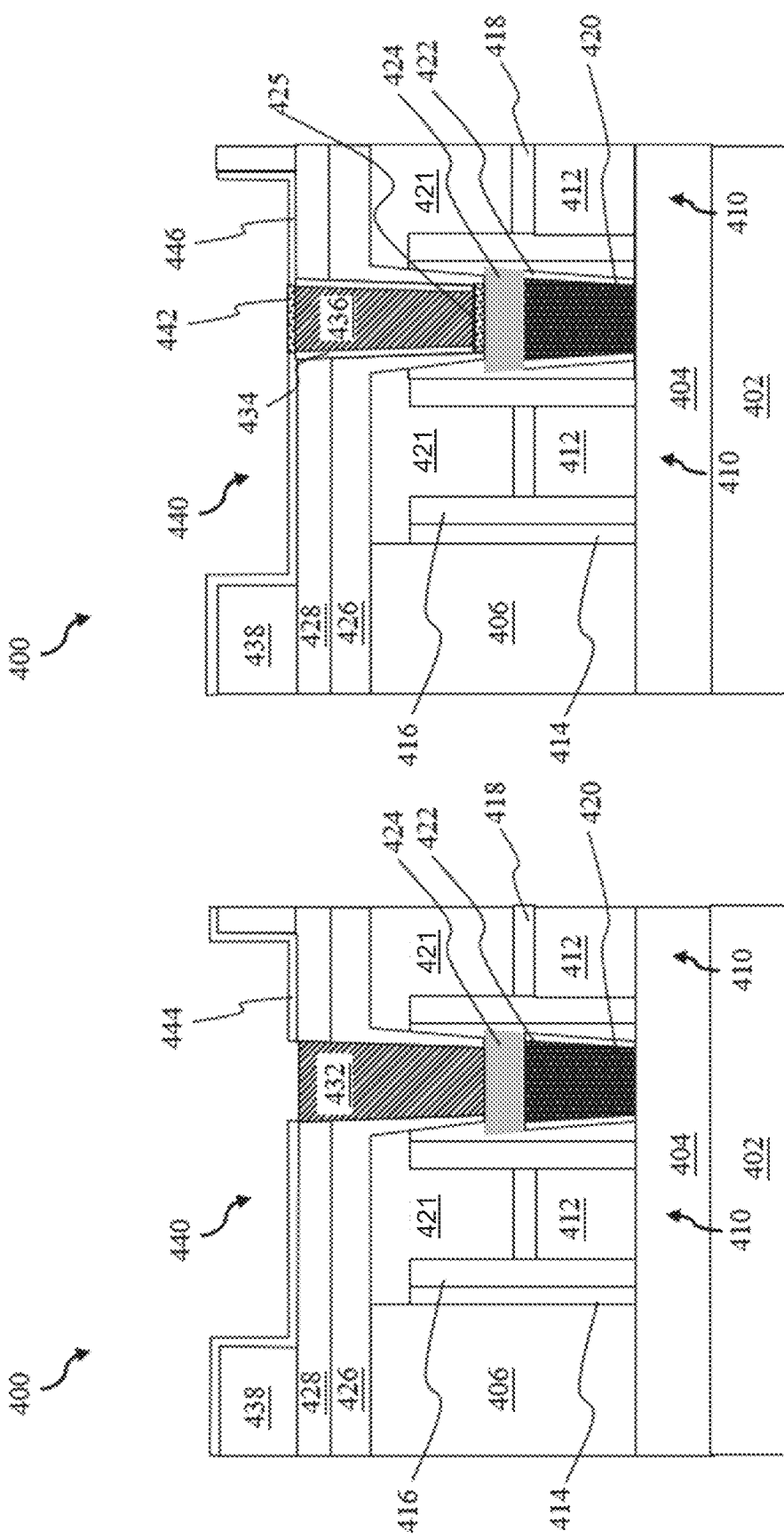

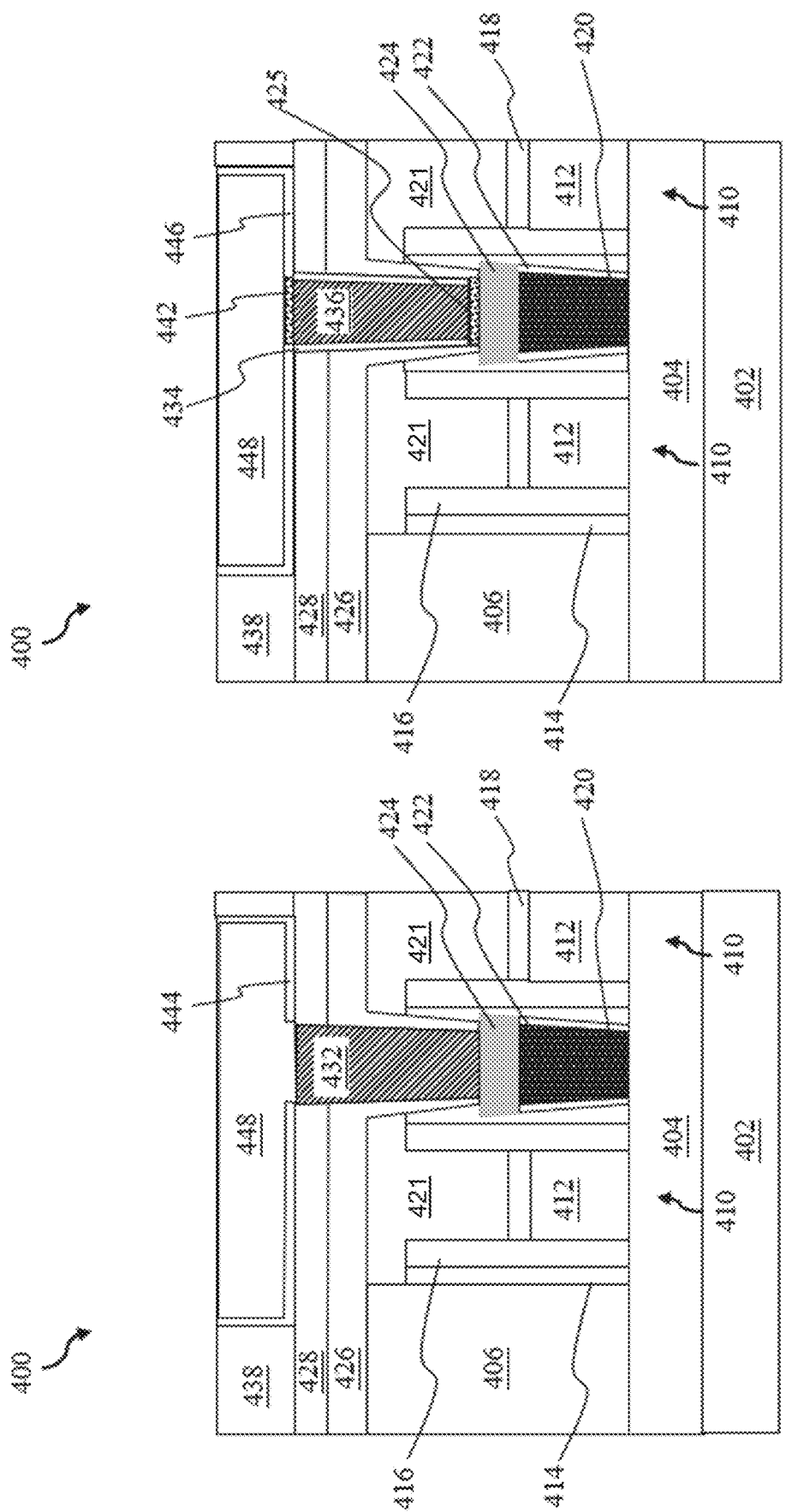

BARRIER-LESS STRUCTURES

PRIORITY DATA

This application is a divisional application of U.S. patent application Ser. No. 16/547,763, filed Aug. 22, 2019, which is hereby incorporated herein by reference in its entirety.

BACKGROUND

The integrated circuit (IC) industry has experienced exponential growth. Technological advances in IC materials and design have produced generations of ICs, where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, as multilayer interconnect (MLI) features become more compact with ever-shrinking IC feature size, interconnects of the MLI features are exhibiting increased contact resistance, which presents performance, yield, and cost challenges. It has been observed that higher contact resistances exhibited by interconnects in advanced IC technology nodes can significantly delay (and, in some situations, prevent) signals from being routed efficiently to and from IC devices, such as transistors, negating any improvements in performance of such IC devices in the advanced technology nodes. Accordingly, although existing interconnects have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 14A and 14B are a flow chart of a method for fabricating a middle-end-of-line (MEOL) contact structure according to various aspects of the present disclosure.

FIGS. 15, 16, 17A, 17B, 18A, 18B, 19A, 19B, 20A, 20B, 21A, 21B, 22A, and 22B are fragmentary cross-sectional views of a MEOL contact structure of a semiconductor device at various stages of fabrication, according to various aspects of the present disclosure.

DETAILED DESCRIPTION

Figure 1A:
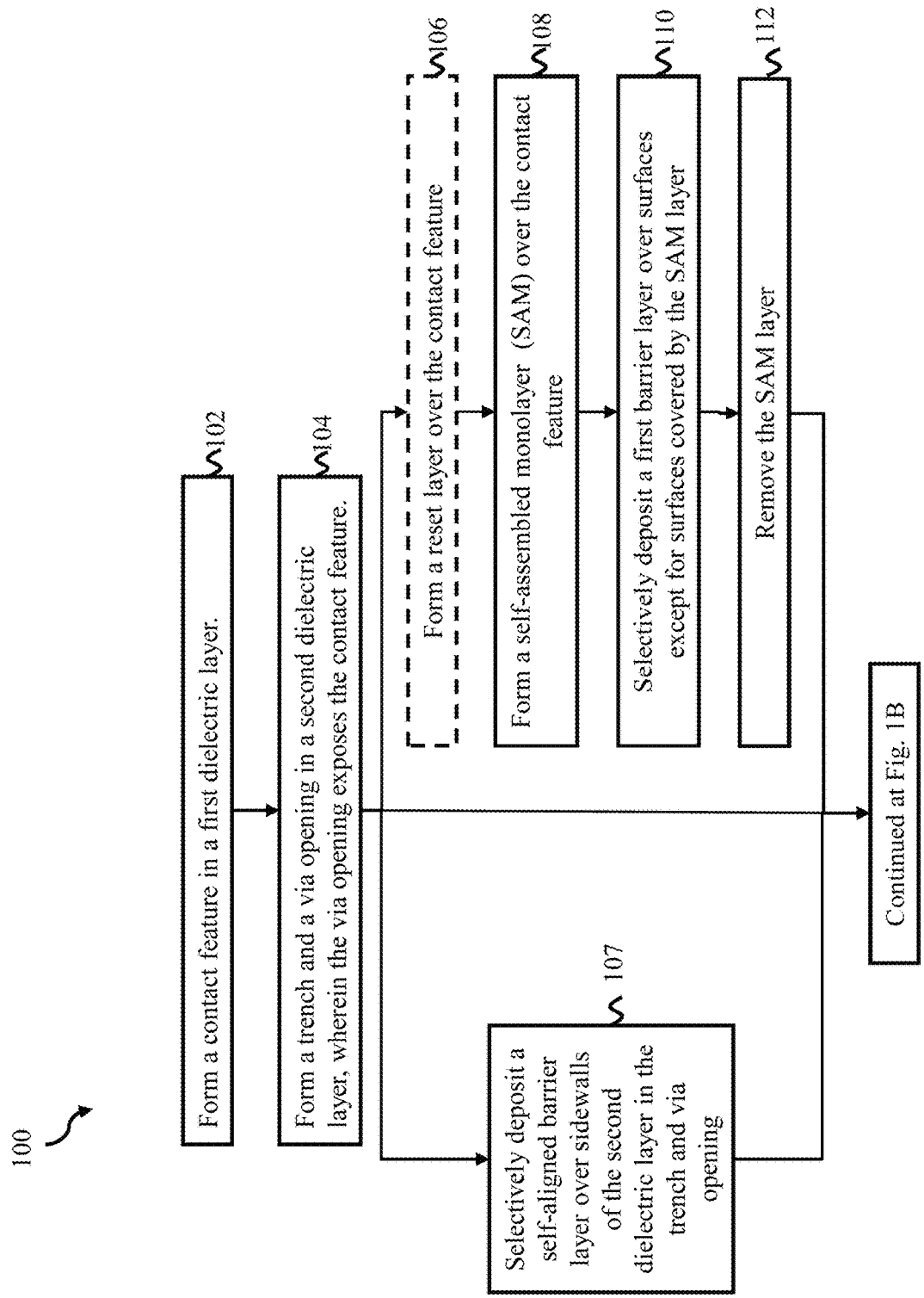
FIGS. 1A and 1B are a flow chart of a method for fabricating a back-end-of-line (BEOL) interconnect structure of a multilayer interconnect feature according to various aspects of the present disclosure.

The present disclosure relates generally to integrated circuit (IC) devices, and more particularly, to multi-layer interconnect features of IC devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

IC manufacturing process flow is typically divided into three categories: front-end-of-line (FEOL), middle-end-of-line (MEOL), and back-end-of-line (BEOL). FEOL generally encompasses processes related to fabricating IC devices, such as transistors. For example, FEOL processes can include forming isolation features, gate structures, and source and drain features (generally referred to as source/drain features). MEOL generally encompasses processes related to fabricating contacts to conductive features (or conductive regions) of the IC devices, such as contacts to the gate structures and/or the source/drain features. BEOL generally encompasses processes related to fabricating a multilayer interconnect (MLI) feature that interconnects IC features fabricated by FEOL and MEOL (referred to herein as FEOL and MEOL features or structures, respectively), thereby enabling operation of the IC devices.

As IC technologies progress towards smaller technology nodes, MEOL and BEOL processes are experiencing significant challenges. For example, advanced IC technology nodes require more compact MLI features, which requires significantly reducing critical dimensions of interconnects of the MLI features (for example, widths and/or heights of vias and/or conductive lines of the interconnects). The reduced critical dimensions have led to significant increases in interconnect resistance, which can degrade IC device performance (for example, by increasing resistance-capacitance (RC) delay). Barrier-free vias have been proposed to replace conventional vias to lower interconnect resistance for advanced IC technology nodes. Conventional vias include a via barrier layer and a via plug, where the via barrier layer is disposed between (1) the via plug and an underlying interconnect feature (such as a device-level contact or a conductive line) and (2) the via plug and a dielectric layer (for example, an interlayer dielectric (ILD) layer and/or a contact etch stop layer (CESL)) in which the via is disposed. Barrier-free vias eliminate the barrier layer and/or any other liner layer, such that the via plug directly contacts the underlying interconnect feature and the dielectric layer. Eliminating the barrier layer (along with other liner layers) increases a volume of the via plug, lowering resistance.

Though barrier-free vias exhibit desirably low resistance, sometimes, via plug materials, such as tungsten, cobalt, and/or ruthenium, do not adhere well to the dielectric layer, such that gaps (or voids) exist between the via plug and the dielectric layer. Poor adhesion of the via plug to the dielectric layer (in particular, to sidewall surfaces and/or bottom surfaces of a via opening in which the via plug is formed) can lead to significant damage of the underlying contact and interconnect feature. When polishing the via plug materials (for example, by a chemical mechanical polishing (CMP) process), slurry used during the polishing has been observed to penetrate an interface between the via plug and the dielectric layer, seep through the gaps between the via plug and the dielectric layer, and attack material of the underlying contact or interconnect feature (in particular, cobalt), degrading its performance. Such performance degradation can be calamitous for device-level contacts. For example, cobalt loss arising from exposure to chemicals during BEOL processing, such as CMP slurry (which is typically an acidic solution (in some implementations, having a pH value of about 2)), have been observed to cause significant yield loss of underlying interconnect features, which is unacceptable for meeting shrinking IC technology node demands. Planarization-induced delamination or peeling of the via plug materials, particularly at a wafer periphery, have also been observed as a result of the poor adhesion between the via plug materials and the dielectric layer. In addition, via plugs of the conventional barrier-free vias may have higher resistance than conventional via plugs.

The present disclosure discloses low-resistance vias and metal line structures (collectively, contact structures) that protect underlying interconnect features (for example, device-level contacts and/or conductive lines) and reduce resistance. In some embodiments of the present disclosure, the low-resistance contact structures include barrier layers on sidewalls of the metal lines that prevent CMP slurries from penetrating through the interface between the vias and a dielectric etch layer. In some implementations, after a first contact feature in a first dielectric layer is exposed in a via opening at a bottom surface of a trench, a self-assembled monolayer (SAM) is selectively formed on a top-facing surface of the exposed first contact feature to inhibit formation of a barrier layer and allow selective formation of the barrier layer on the sidewalls of the via opening and trench. In some other implementations, a contact via underneath a metal line is a barrier-free via formed using a bottom-up deposition technique and planarization is performed to a metal line disposed over the contact via. Different embodiments may have different advantages, and no particular advantage is required of any embodiment.

Figure 1B:
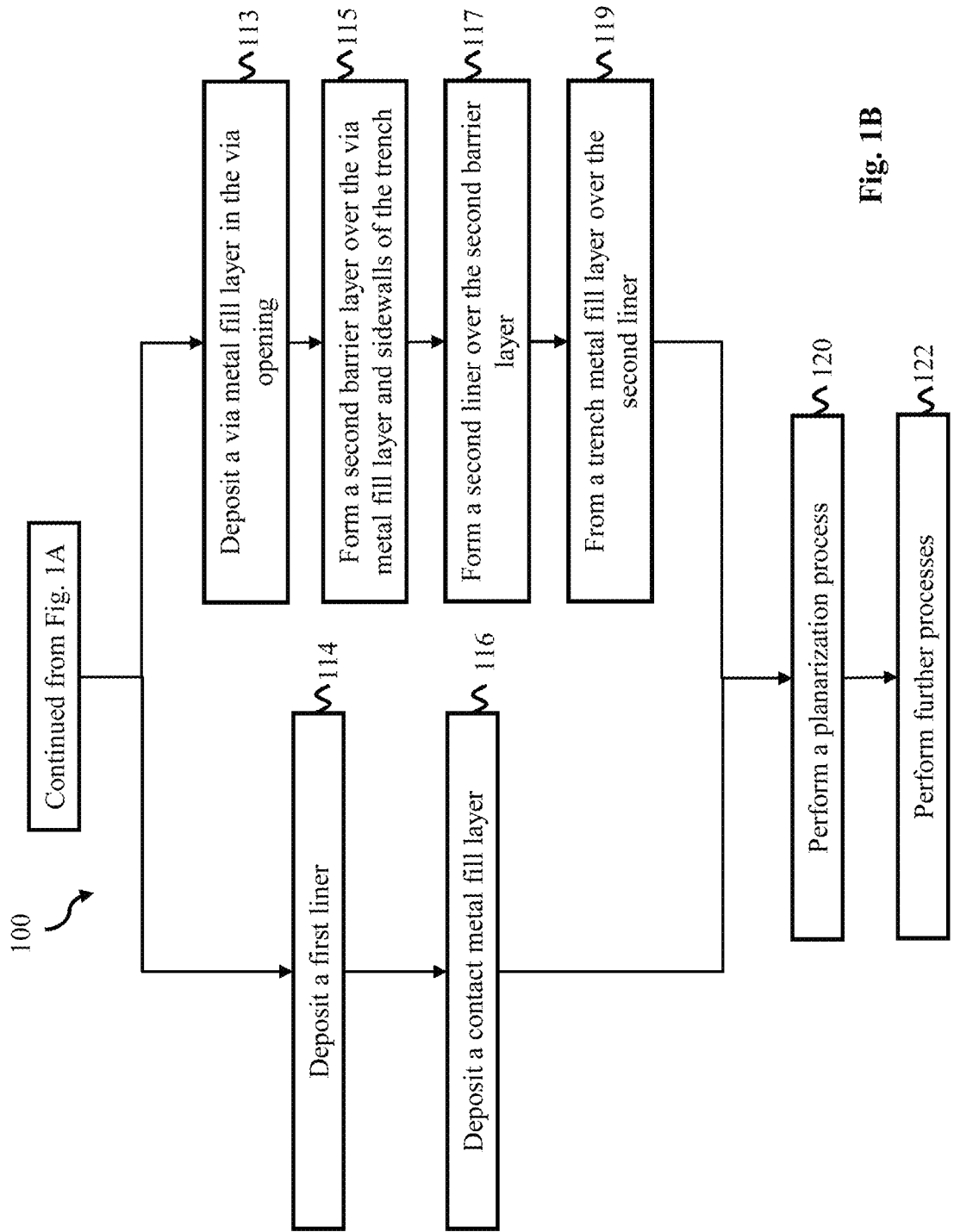

FIGS. 1A and 1B illustrate a flow chart of a method 100 for fabricating a BEOL interconnect structure of a semiconductor device according to various aspects of the present disclosure. FIGS. 2, 3, 4A-4B, 5A-5B, 6A-6B, 7A-7C, 8A-8C, 9A-9C, and 10-13 are fragmentary cross-sectional views of an interconnect structure of a semiconductor device at various stages of fabrication according to various embodiments of method 100 of the present disclosure. Additional steps can be provided before, during, and after method 100, and some of the steps described can be moved, replaced, or eliminated for additional embodiments of method 100. Additional features can be added in the interconnect structure depicted in FIGS. 2, 3, 4A-4B, 5A-5B, 6A-6B, 7A-7C, 8A-8C, 9A-9C, and 10-13, and some of the features described below can be replaced, modified, or eliminated in other embodiments of the interconnect structure depicted in FIGS. 2, 3, 4A-4B, 5A-5B, 6A-6B, 7A-7C, 8A-8C, 9A-9C, and 10-13.

Figure 2:
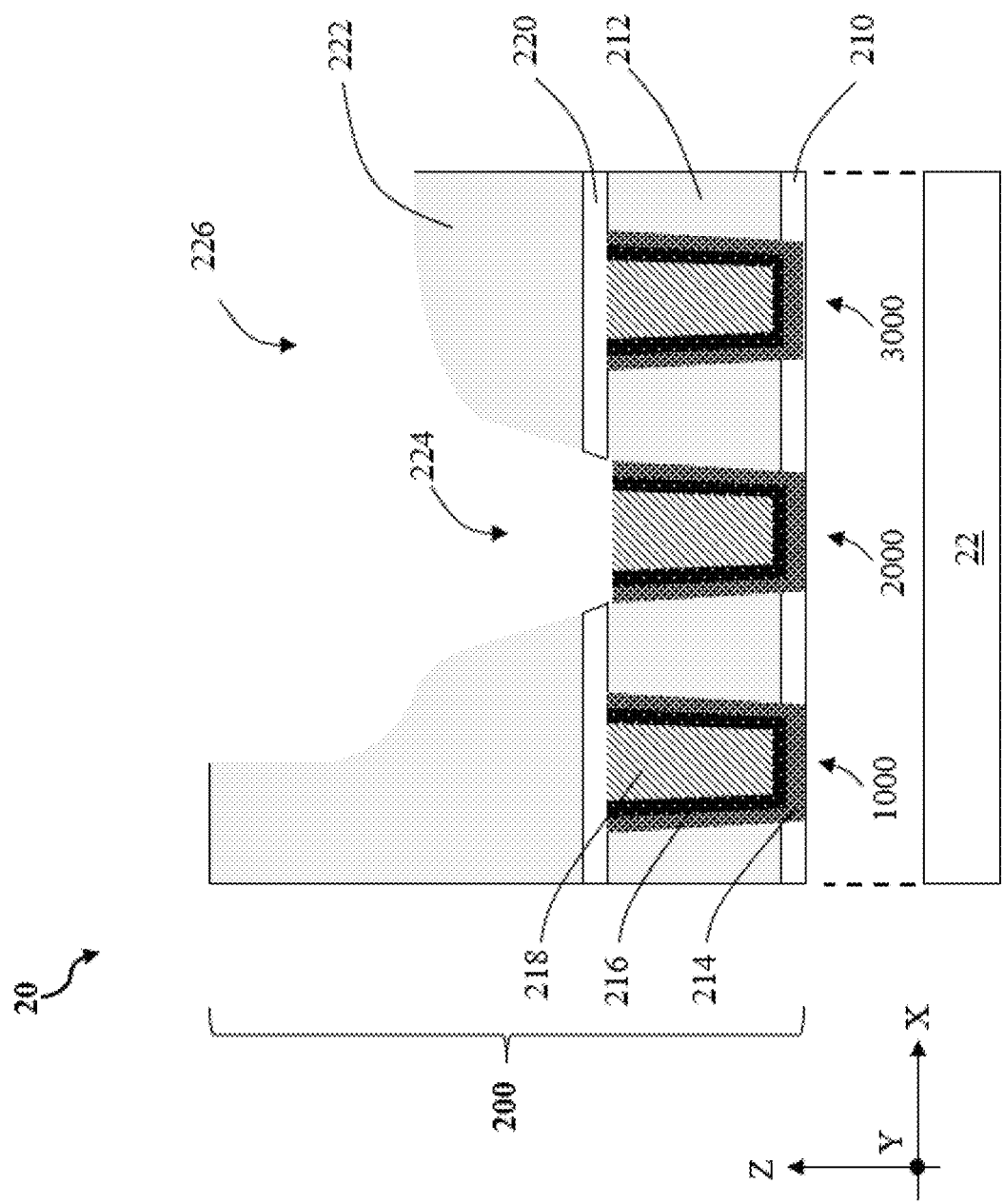
FIGS. 2, 3, 4A-4B, 5A-5B, 6A-6B, 7A-7C, 8A-8C, 9A-9C, and 10-13 are fragmentary cross-sectional views of an interconnect structure of a semiconductor device at various stages of fabrication, according to various aspects of the present disclosure.

Referring to FIG. 1A and FIG. 2, the method 100 includes a block 102 where a contact feature, such as one of the contact features 1000, 2000, or 3000, is formed in a first dielectric layer 212 of an interconnect structure 200 in a semiconductor device 20. The first dielectric layer 212 may be a first interlayer dielectric (ILD) layer formed over the semiconductor device 20 in a workpiece. The semiconductor device 20 can be included in a microprocessor, a memory, and/or other IC device. In some implementations, the semiconductor device 20 is a portion of an IC chip, a system on chip (SoC), or portion thereof, that includes various passive and active microelectronic devices, such as resistors, capacitors, inductors, diodes, p-type field effect transistors (PFETs), n-type field effect transistors (NFETs), metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. The transistors may be planar transistors or multi-gate transistors, such as fin-like FETs (FinFETs). FIG. 2 has been simplified for the sake of clarity to better understand the inventive concepts of the present disclosure. Additional features can be added in the semiconductor device 20, and some of the features described below can be replaced, modified, or eliminated in other embodiments of the semiconductor device 20.

The semiconductor device 20 includes a substrate (wafer) 22. In the depicted embodiment, substrate 22 includes silicon. Alternatively or additionally, substrate 22 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, substrate 22 includes one or more group III-V materials, one or more group II-IV materials, or combinations thereof. In some implementations, substrate 22 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 22 can include various doped regions (not shown) configured according to design requirements of semiconductor device 20, such as p-type doped regions, n-type doped regions, or combinations thereof. P-type doped regions (for example, p-type wells) include p-type dopants, such as boron, indium, other p-type dopant, or combinations thereof. N-type doped regions (for example, n-type wells) include n-type dopants, such as phosphorus, arsenic, other n-type dopant, or combinations thereof. In some implementations, substrate 22 includes doped regions formed with a combination of p-type dopants and n-type dopants. The various doped regions can be formed directly on and/or in substrate 22, for example, providing a p-well structure, an n-well structure, a dual-well structure, a raised structure, or combinations thereof. An ion implantation process, a diffusion process, and/or other suitable doping process can be performed to form the various doped regions. For simplicity, the substrate 22 is not illustrated in FIGS. 3, 4A-4B, 5A-5B, 6A-6B, 7A-7C, 8A-8C, 9A-9C, and 10-13.

An isolation feature(s) (not shown) is formed over and/or in substrate 22 to isolate various regions, such as various device regions, of semiconductor device 20. For example, isolation features define and electrically isolate active device regions and/or passive device regions from each other. Isolation features include silicon oxide, silicon nitride, silicon oxynitride, other suitable isolation material, or combinations thereof. Isolation features can include different structures, such as shallow trench isolation (STI) structures, deep trench isolation (DTI) structures, and/or local oxidation of silicon (LOCOS) structures. In some implementations, isolation features include STI features. For example, STI features can be formed by etching a trench in substrate 22 (for example, by using a dry etch process and/or wet etch process) and filling the trench with insulator material (for example, by using a chemical vapor deposition (CVD) process or a spin-on glass process). A chemical mechanical polishing (CMP) process may be performed to remove excessive insulator material and/or planarize a top surface of isolation features. In some embodiments, STI features include a multi-layer structure that fills the trenches, such as a silicon nitride layer disposed over an oxide liner layer.

While not shown, various gate structures are disposed over the substrate 22 and one or more of them interpose a source region and a drain region, where a channel region is defined between the source region and the drain region. The one or more gate structures engage the channel region, such that current can flow between the source/drain regions during operation. In some implementations, gate structures are formed over a fin structure, such that gate structures each wrap a portion of the fin structure. For example, one or more of gate structures wrap channel regions of the fin structure, thereby interposing source regions and drain regions of the fin structure. In some embodiments, gate structures include metal gate (MG) stacks that are configured to achieve desired functionality according to design requirements of the semiconductor device 20. In some implementations, metal gate stacks include a gate dielectric and a gate electrode over the gate dielectric. The gate dielectric includes a dielectric material, such as silicon oxide, high-k dielectric material, other suitable dielectric material, or combinations thereof. High-k dielectric material generally refers to dielectric materials having a high dielectric constant, for example, greater than a dielectric constant of silicon oxide (k≈3.9). Exemplary high-k dielectric materials include hafnium, aluminum, zirconium, lanthanum, tantalum, titanium, yttrium, oxygen, nitrogen, other suitable constituent, or combinations thereof. In some implementations, the gate dielectric includes a multilayer structure, such as an interfacial layer including, for example, silicon oxide, and a high-k dielectric layer including, for example, $HfO_2$, HfSiO, HfSiON, HfTaO, HfTiO, HfZrO, $ZrO_2$, $Al_2O_3$, $HfO_2$—$Al_2O_3$, $TiO_2$, $Ta_2O_5$, $La_2O_3$, $Y_2O_3$, other suitable high-k dielectric material, or combinations thereof. The gate electrode includes an electrically conductive material. In some implementations, the gate electrode includes multiple layers, such as one or more capping layers, work function layers, glue/barrier layers, and/or metal fill (or bulk) layers. A capping layer can include a material that prevents or eliminates diffusion and/or reaction of constituents between the gate dielectric and other layers of the gate electrode. In some implementations, the capping layer includes a metal and nitrogen, such as titanium nitride (TiN), tantalum nitride (TaN), tungsten nitride ($W_2N$), titanium silicon nitride (TiSiN), tantalum silicon nitride (TaSiN), or combinations thereof. A work function layer includes a conductive material tuned to have a desired work function (such as an n-type work function or a p-type work function), such as n-type work function materials and/or p-type work function materials. P-type work function materials include TiN, TaN, Ru, Mo, Al, WN, $ZrSi_2$, $MoSi_2$, $TaSi_2$, $NiSi_2$, WN, other p-type work function material, or combinations thereof. N-type work function materials include Ti, Al, Ag, Mn, Zr, TiAl, TiAlC, TaC, TaCN, TaSiN, TaAl, TaAlC, TiAlN, other n-type work function material, or combinations thereof. A glue/barrier layer can include a material that promotes adhesion between adjacent layers, such as the work function layer and the metal fill layer, and/or a material that blocks and/or reduces diffusion between gate layers, such as the work function layer and the metal fill layer. For example, the glue/barrier layer includes metal (for example, W, Al, Ta, Ti, Ni, Cu, Co, other suitable metal, or combinations thereof), metal oxides, metal nitrides (for example, TiN), or combinations thereof. A metal fill layer can include a suitable conductive material, such as Al, W, and/or Cu.

Epitaxial source features and epitaxial drain features (referred to as epitaxial source/drain features) may be disposed in source/drain regions of substrate 22. Gate structure and epitaxial source/drain features form a portion of a transistor of the semiconductor device 20. Gate structure and/or epitaxial source/drain features are thus alternatively referred to as device features. In some implementations, epitaxial source/drain features wrap source/drain regions of a fin structure. An epitaxy process can implement CVD deposition techniques (for example, vapor-phase epitaxy (VPE), ultra-high vacuum CVD (UHV-CVD), LPCVD, and/or PECVD), molecular beam epitaxy, other suitable SEG processes, or combinations thereof. Epitaxial source/drain features may be doped with n-type dopants and/or p-type dopants. In some implementations, where the transistor is configured as an n-type device (for example, having an n-channel), epitaxial source/drain features can be silicon-containing epitaxial layers or silicon-carbon-containing epitaxial layers doped with phosphorous, other n-type dopant, or combinations thereof (for example, forming Si:P epitaxial layers or Si:C:P epitaxial layers). In some implementations, where the transistor is configured as a p-type device (for example, having a p-channel), epitaxial source/drain features can be silicon-and-germanium-containing epitaxial layers doped with boron, other p-type dopant, or combinations thereof (for example, forming Si:Ge:B epitaxial layers). In some implementations, annealing processes are performed to activate dopants in epitaxial source/drain features of the semiconductor device 20.

In some implementations, silicide layers are formed on epitaxial source/drain features. In some implementations, silicide layers are formed by depositing a metal layer over epitaxial source/drain features. The metal layer includes any material suitable for promoting silicide formation, such as nickel, platinum, palladium, vanadium, titanium, cobalt, tantalum, ytterbium, zirconium, other suitable metal, or combinations thereof. The semiconductor device 20 is then heated (for example, subjected to an annealing process) to cause constituents of epitaxial source/drain features (for example, silicon and/or germanium) to react with the metal. The silicide layers thus include metal and a constituent of epitaxial source/drain features (for example, silicon and/or germanium). In some implementations, the silicide layers include nickel silicide, titanium silicide, or cobalt silicide. Any un-reacted metal, such as remaining portions of the metal layer, is selectively removed by any suitable process, such as an etching process.

The interconnect structure 200 is disposed over substrate 22. The interconnect structure 200 may electrically couple various devices (for example, transistors, resistors, capacitors, and/or inductors) and/or components (for example, gate structures and/or source/drain features) of the semiconductor device 20, such that the various devices and/or components can operate as specified by design requirements of the semiconductor device 20. The interconnect structure 200 includes a combination of dielectric layers and electrically conductive layers (for example, metal layers) configured to form various interconnect structures. The conductive layers are configured to form vertical interconnect features (providing, for example, vertical connection between features and/or vertical electrical routing), such as contacts and/or vias, and/or horizontal interconnect features (providing, for example, horizontal electrical routing), such as conductive lines (or metal lines). Vertical interconnect features typically connect horizontal interconnect features in different layers the interconnect structure 200. During operation, the interconnect features are configured to route signals between the devices and/or the components of the semiconductor device 20 and/or distribute signals (for example, clock signals, voltage signals, and/or ground signals) to the devices and/or the components of the semiconductor device 20. Though the interconnect structure 200 is depicted with a given number of dielectric layers and conductive layers, the present disclosure contemplates the interconnect structure 200 having more or less dielectric layers and/or conductive layers.

Referring still to FIG. 2, the interconnect structure 200 includes one or more dielectric layers (i.e. ILD layers), such as the first dielectric layer 212 and other dielectric layers over the first dielectric layer 212. These dielectric layers include a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Aerogel, amorphous fluorinated carbon, Parylene, BCB, SiLK (Dow Chemical, Midland, Michigan), polyimide, other low-k dielectric material, or combinations thereof. In some embodiments, the interconnect structure 200 may also include one or more contact etch stop layers (CESL) disposed over substrate 22, such as a first CESL 210 under the first dielectric layer 212, a second CESL 220 over the first dielectric layer 212, and other CESLs over the second CESL 220. CESLs include a material different than the ILD layers. For example, the material of the first dielectric layer 212 is different than the material of the first CESL 210. In some embodiments, CESLs, such as the first CESL 210 and the second CESL 220 include silicon and nitrogen, such as silicon nitride or silicon oxynitride. The ILD layers and/or CESLs are formed over substrate 22, for example, by a deposition process (such as CVD, PVD, ALD, HDPCVD, MOCVD, RPCVD, PECVD, LPCVD, ALCVD, APCVD, plating, other suitable methods, or combinations thereof). In some implementations, ILD layers and/or CESLs are formed by a flowable CVD (FCVD) process that includes, for example, depositing a flowable material (such as a liquid compound) over substrate 22 and converting the flowable material to a solid material by a suitable technique, such as thermal annealing and/or ultraviolet radiation treating. Subsequent to the deposition of ILD layers and/or CESLs, a CMP process and/or other planarization process is performed, such that ILD layers and/or CESLs have substantially planar surfaces for enhancing formation of overlying layers.

At block 102 of the method 100, contact features 1000, 2000 and 3000 are formed in the first dielectric layer 212. Contact features 1000, 2000 and 3000 represent BEOL contact features that interface MEOL device-level contacts, such as gate contacts electrically coupled to gate structures and source/drain contacts electrically coupled to the epitaxial source/drain features. In some embodiments illustrated in FIG. 2, the contact features 1000, 2000 and 3000 may include a barrier layer 214, a liner 216 and a metal fill layer 218. In some implementations, the barrier layer 214 may be formed of Ta, TaN, TaC, Ti, TiN, TiC, and other suitable material that can block oxygen diffusion. The liner 216 may be formed of suitable metal, metal nitride, or metal carbide, such as Co, CoN and RuN. The metal fill layer 218 may be formed of any suitable conductive material, such as W, Ni, Ta, Ti, Al, Cu, Co, TaN, TiN, Ru, and/or other suitable conductive materials. In some embodiments, the contact features 1000, 2000 and 3000 may be formed by patterning the first dielectric layer 212 and the first CESL 210. Patterning the first dielectric layer 212 and first CESL 210 can include lithography processes and/or etching processes to form via openings. In some implementations, the lithography processes include forming a resist layer over the first dielectric layer 212 and/or first CESL 210, exposing the resist layer to pattern radiation, and developing the exposed resist layer, thereby forming a patterned resist layer that can be used as a masking element for etching openings in the first dielectric layer 212 and/or first CESL 210. The etching processes include dry etching processes, wet etching processes, other etching processes, or combinations thereof. Thereafter, the opening(s) are filled with the barrier layer 214, the liner 216, and the metal fill layer 218. In some embodiments, the barrier layer 214 may be deposited using atomic layer deposition (ALD), chemical vapor deposition (CVD), or electroless deposition (ELD) and may be formed to a thickness between about 0.5 nm and about 5 nm. In some implementations, the liner 216 may be deposited using ALD, CVD, ELD, or physical vapor deposition (PVD) and may be formed to a thickness between about 0.5 nm and 3 nm. In some instances, the metal fill layer 218 may be deposited using PVD, CVD, ALD, electroplating, ELD, or other suitable deposition process, or combinations thereof. Thereafter, any excess material(s) can be removed by a planarization process, such as a CMP process, thereby planarizing top surfaces of the first dielectric layer 212, the barrier layer 214, the liner 216, and the metal fill layer 218.

After the top surfaces of the first dielectric layer 212, the barrier layer 214, the liner 216, and the metal fill layer 218 are planarized, the second CESL 220 may be deposited over the first dielectric layer 212 and a second dielectric layer 222 may be deposited over the second CESL 220. The second CESL 220 may be formed using materials and processes similar to those used for forming the first CESL 210. For simplicity, the formation and materials of second CESL 220 are not repeated here. Similarly, the second dielectric layer 222 may be formed using materials and processes similar to those used for forming the first dielectric layer 212 and is not described further here.

Referring still to FIGS. 1A and 2, the method 100 includes a block 104 where a trench 226 and a via opening 224 may be formed in the second dielectric layer 222 and through the second CESL 220. In some embodiments, the trench 226 is larger than the via opening 224 in dimensions along the X direction and/or the Y direction. The trench 226 may be utilized to form a conductive line (or metal line) that extends along the X direction or the Y direction. In some representative implementations shown in FIG. 2, the contact feature 2000 is exposed through the via opening 224 in the bottom surface of the trench 226.

Figure 3:
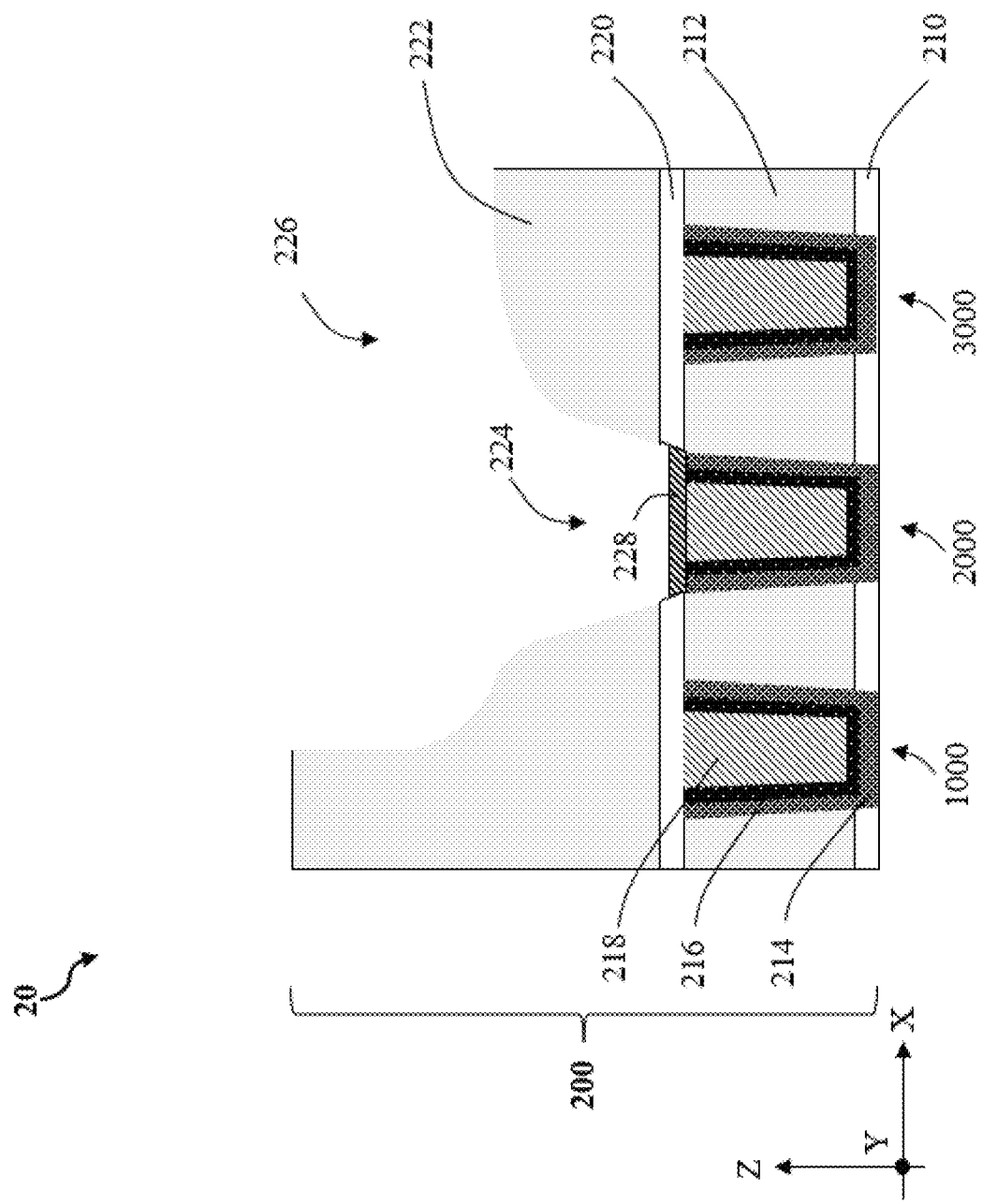

Referring to FIGS. 1A and 3, the method 100 may optionally include a block 106 where a reset layer 228 may be formed over the exposed contact feature 2000. The reset layer 228 is a conductive layer and has a composition different from that of the barrier layer 214, the liner 216, or the metal fill layer 218. The reset layer 228 functions as a layer to "reset" the surface property of the exposed contact feature 2000. As will be described below with respect to block 108, in some embodiments, a self-assembled monolayer (SAM) 230 may be deposited on the exposed contact feature 2000. However, in some embodiments, the SAM 230 may not be selectively formed directly on the exposed contact feature 2000, such as the exposed first metal fill layer 218. In those embodiments, the reset layer 228 that is deposited on the contact feature 2000 would become an interface or façade of the underlying top surface of the contact feature 2000. In some implementations, the reset layer 228 may be formed of cobalt or ruthenium and may be formed using ALD, CVD or ELD to a thickness between about 0.5 nm and 5 nm. In some implementations, the formation of the reset layer 228 does not include any lithography steps and is performed in a selective, bottom-up, or self-aligned manner. In that regard, the precursors and formation process of the reset layer 228 are selected such that the precursors selectively deposit on the metal/metal nitride surface of the exposed contact feature 2000 and the reset layer 228 thickens from the bottom up. In some instances, the dielectric sidewalls of the via opening 224 and the trench 226 may be substantially free of the reset layer 228.

Figure 4A:
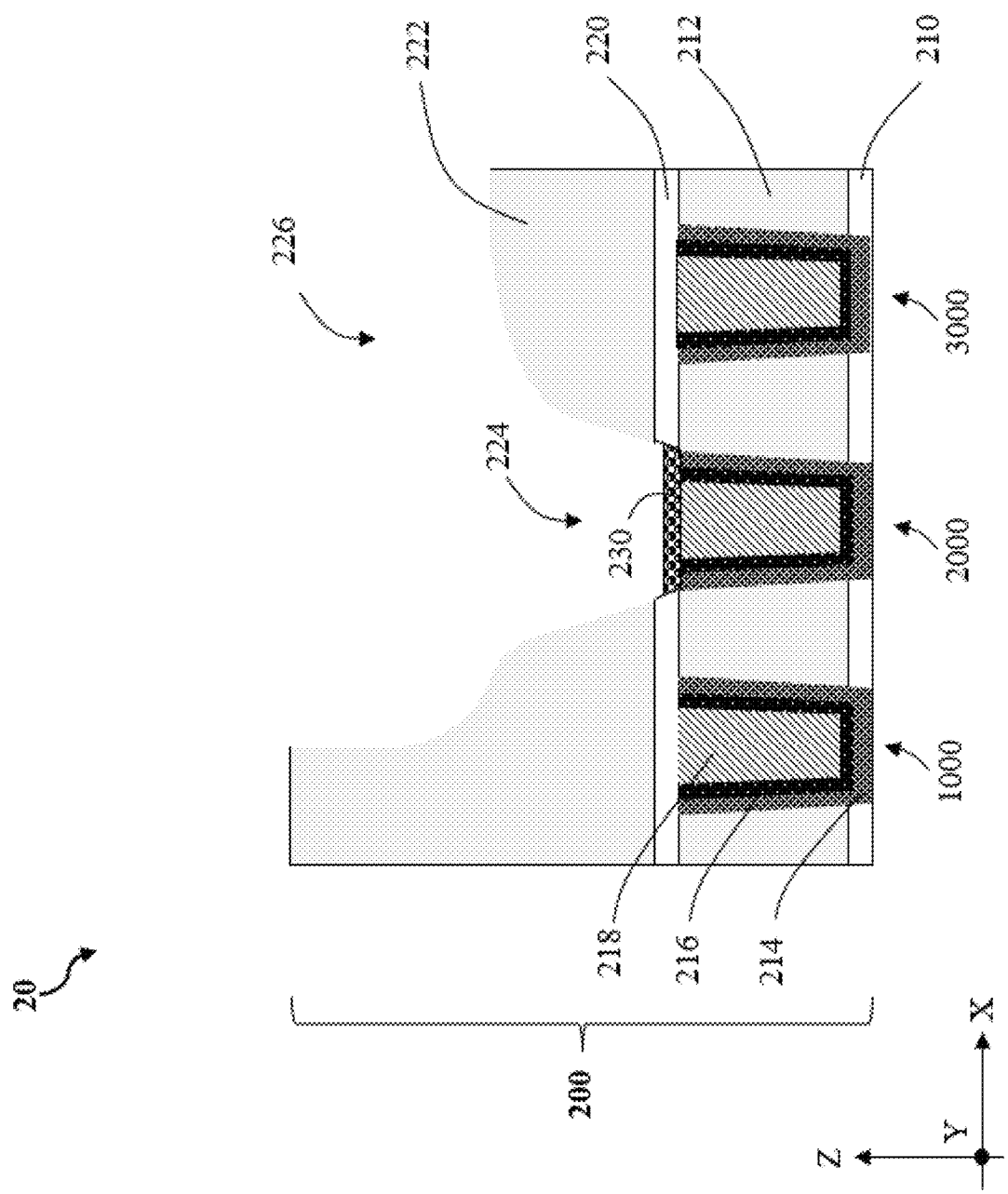
Figure 4B:
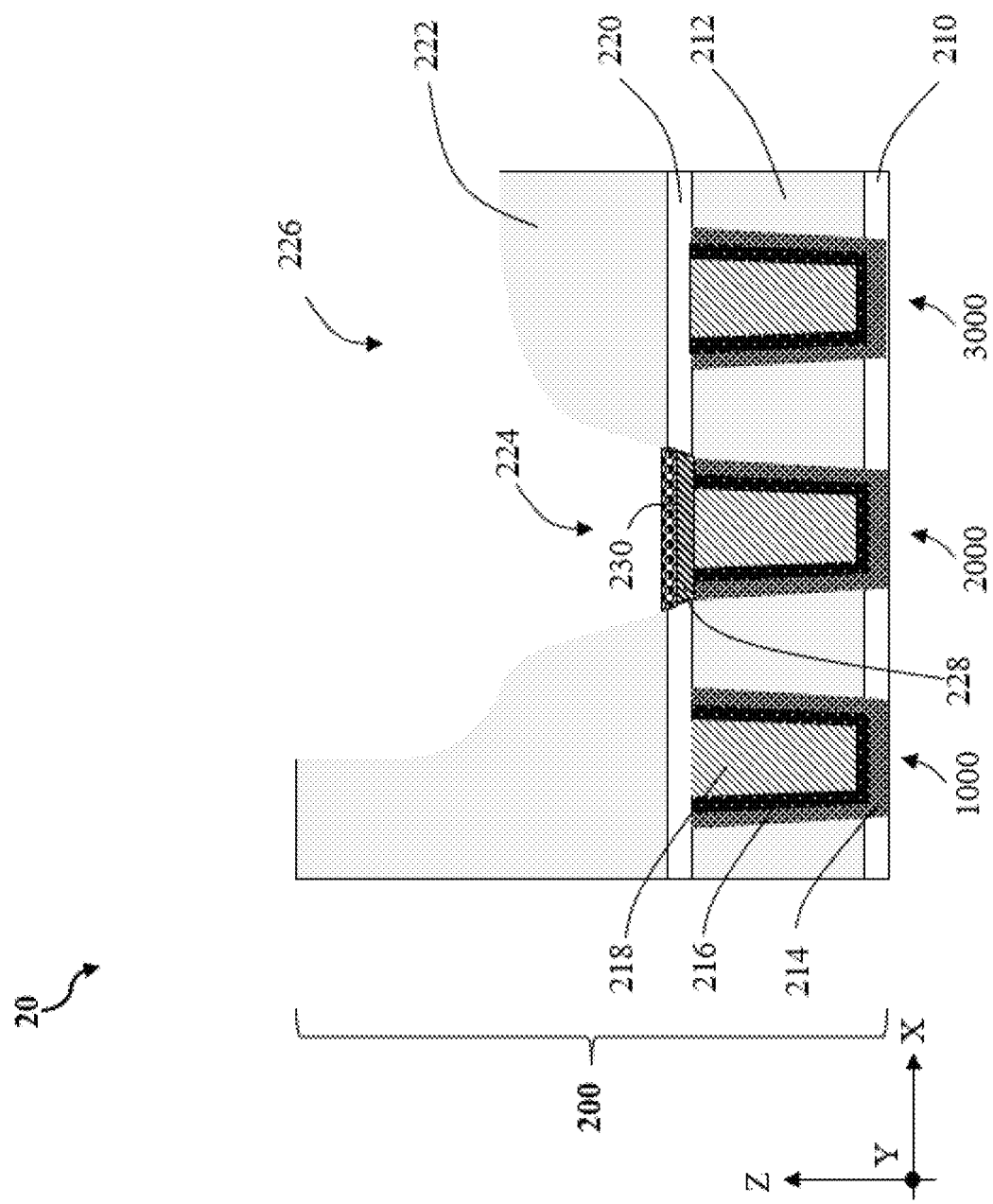

Referring to FIGS. 1A, 4A and 4B, the method 100 includes a block 108 where a self-assembled monolayer (SAM) 230 is formed over the exposed contact feature 2000. In the embodiments illustrated in FIG. 4A, the SAM 230 is formed directly on the exposed contact feature 2000. In embodiments where the reset layer 228 is formed, the SAM 230 is formed directly on the reset layer 228. The SAM 230 may be formed of a molecule that includes a head group (or anchor) and a tail group. In some instances, the head group may include phosphorus (P), sulfur (S), or silicon (Si), which in some cases may be in the form of phosphate, sulfate, or silane based substances. The tail group may include a carbon chain, such as one including alkenes and alkynes. In some examples, the molecule forming the SAM 230 (or the head group of the molecule for the SAM 230) may include ODPA (Octadecylphosphonic acid), organosulfurs, or thiols (e.g., dodecanethiol, alkanethiol). In some other implementations, the molecule forming the SAM 230 may include (3-aminopropyl)triethoxysilane (APTES). In some instances, the SAM 230 is attachable to a conductive layer, such as the reset layer 228, the liner 216 and the metal fill layer 218 but does not substantially attach to the surfaces of the second CESL 220 and the second dielectric layer 222, which are formed of dielectric materials.

Figure 5A:
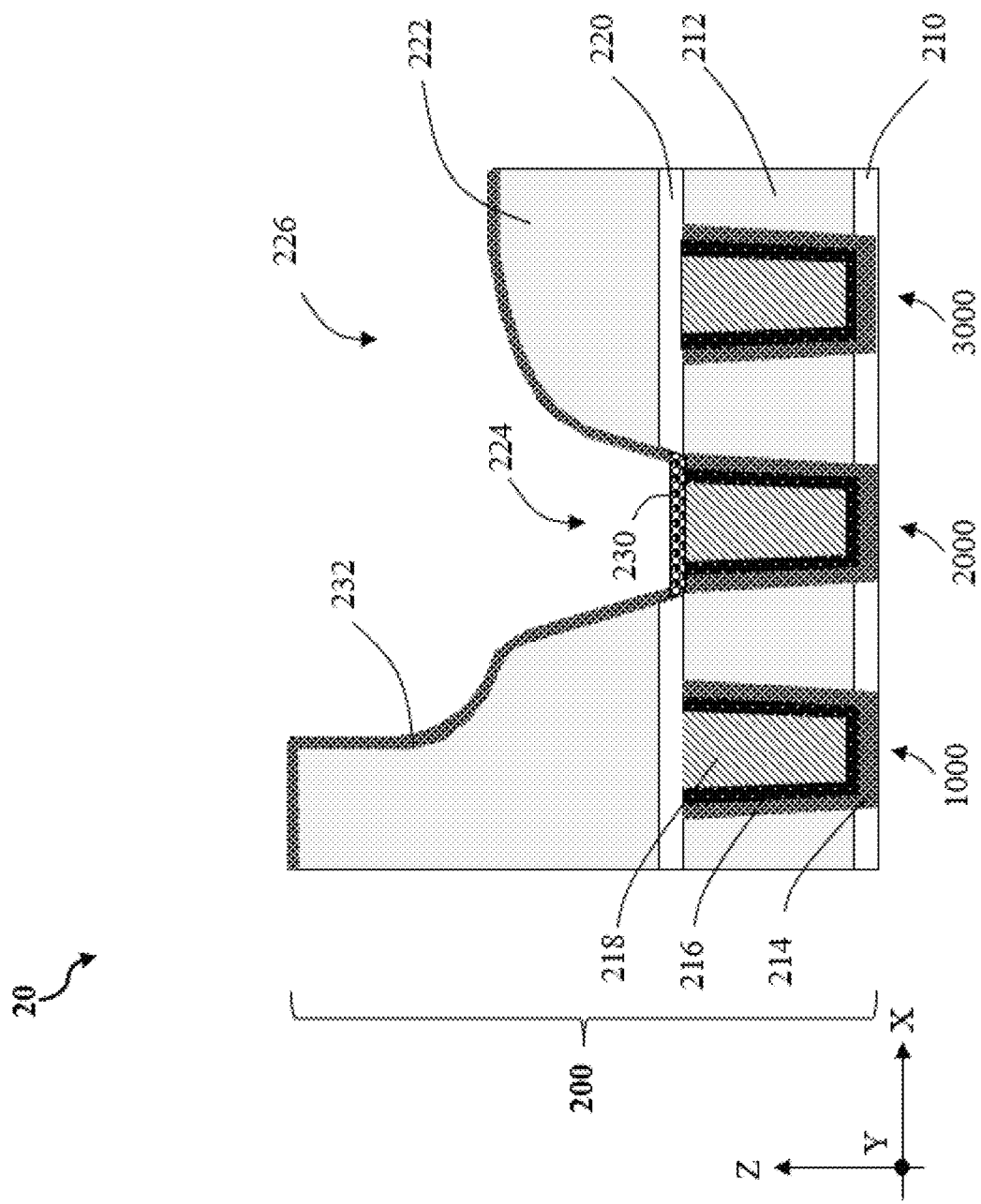
Figure 5B:
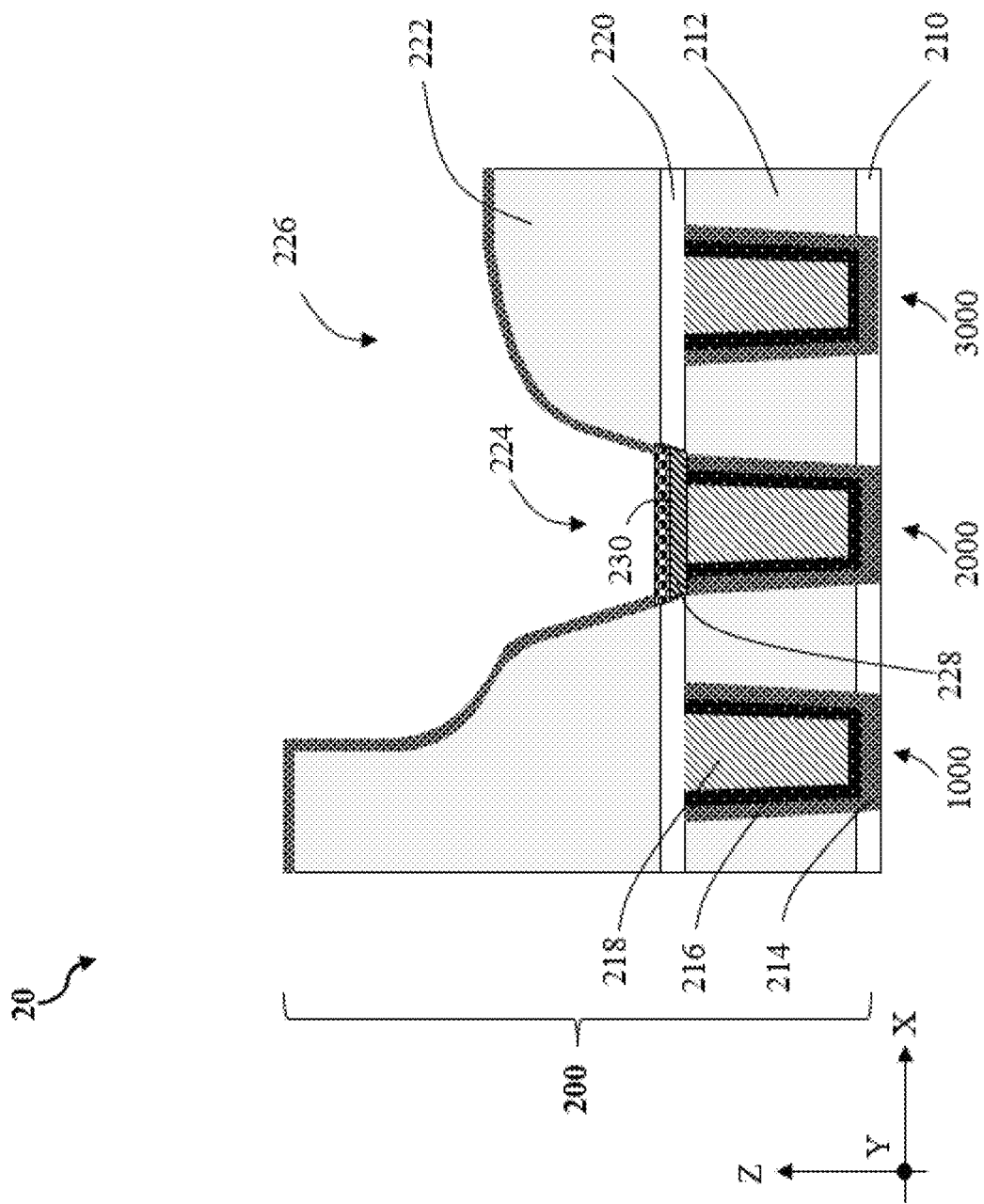
Figure 6A:
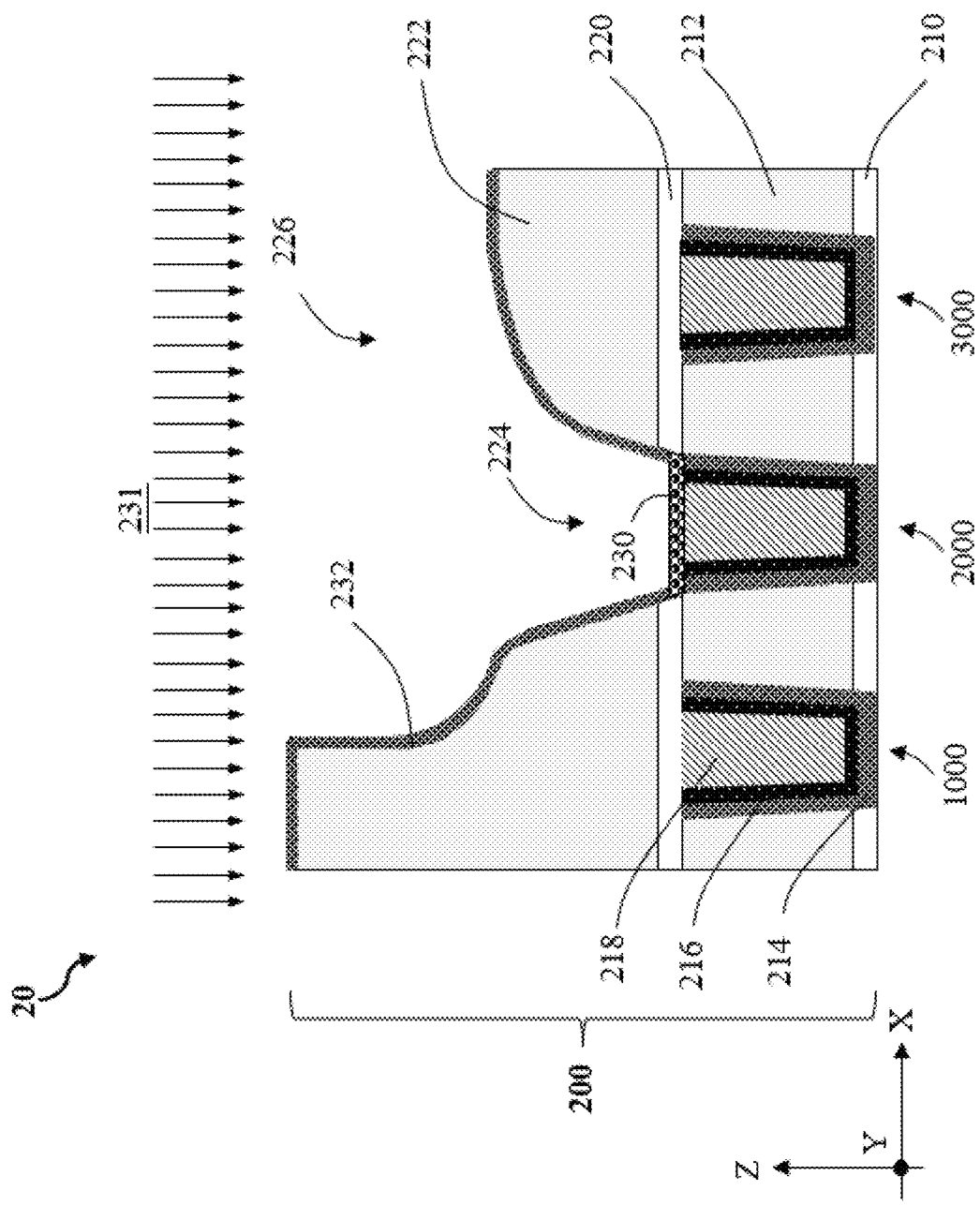
Figure 6B:
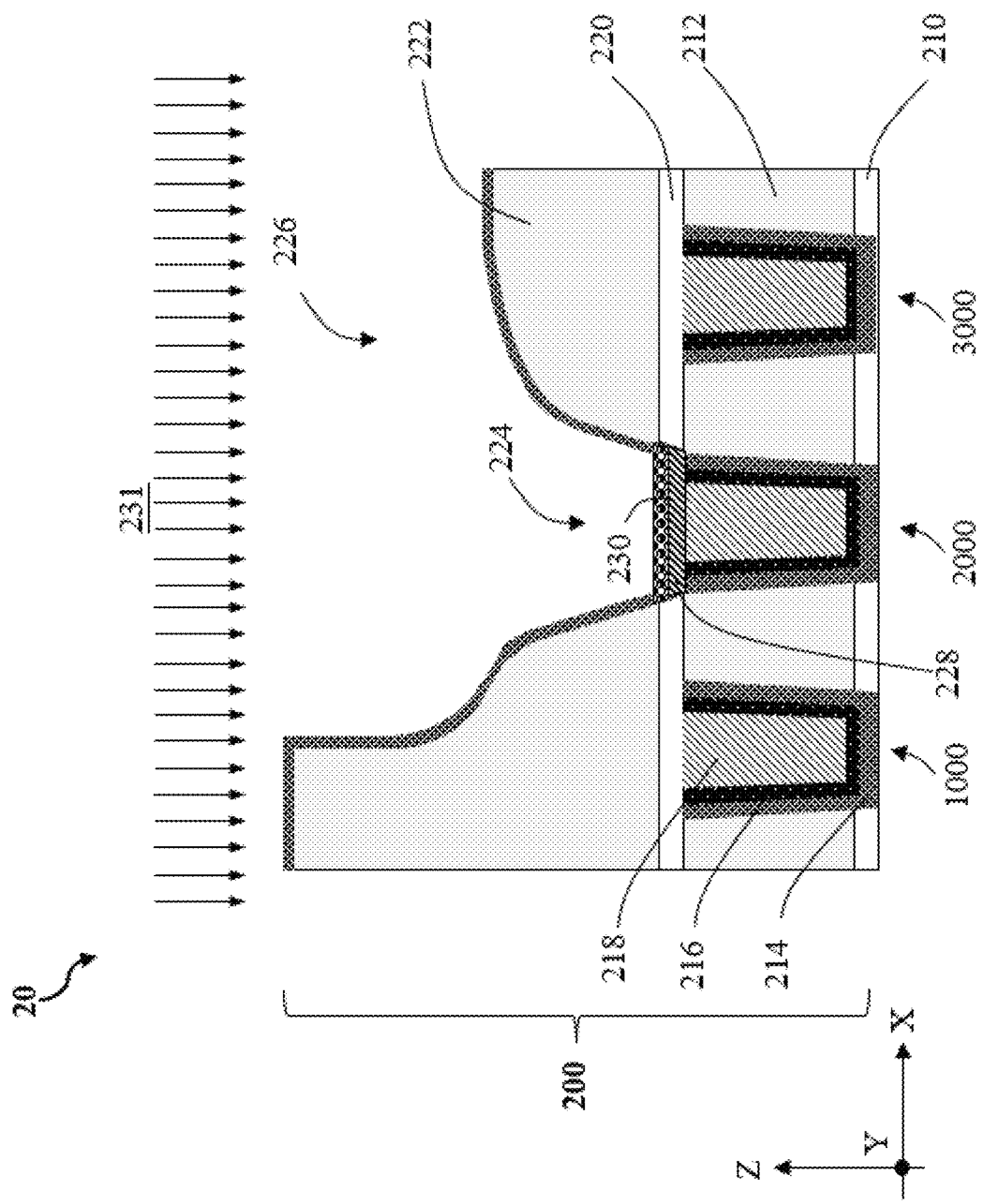

Referring to FIGS. 1A, 5A and 5B, the method 100 includes a block 110 where the first barrier layer 232 is selectively deposited over surfaces of semiconductor device 20 except for surfaces covered by the SAM 230. In some embodiments, the precursors and processes for formation of the first barrier layer 232 are selected such that that the first barrier layer 232 is selectively deposited on surfaces of the second dielectric layer 222, including sidewalls of the via opening 224 and the trench 226 and the top surface of SAM 230 is substantially free of the first barrier layer 232. In this regard, because precursors of the first barrier layer 232 have low affinity to the SAM 230 (i.e. the SAM 230 repels the precursors of the first barrier layer 232), the SAM 230 functions as a blocking layer or a hinderance layer for the first barrier layer 232. In some embodiments, the first barrier layer 232 may be formed of Ta, TaN, TaC, Ti, TiN, TiC, and other suitable material that can block oxygen diffusion, and may be deposited using ALD, CVD, or ELD and may be formed to a thickness between about 0.5 nm and about 5 nm. The reset layer 228 is formed in the embodiments illustrated in FIG. 5B but is not in the embodiments illustrated in FIG. 5A.

Figure 7A:
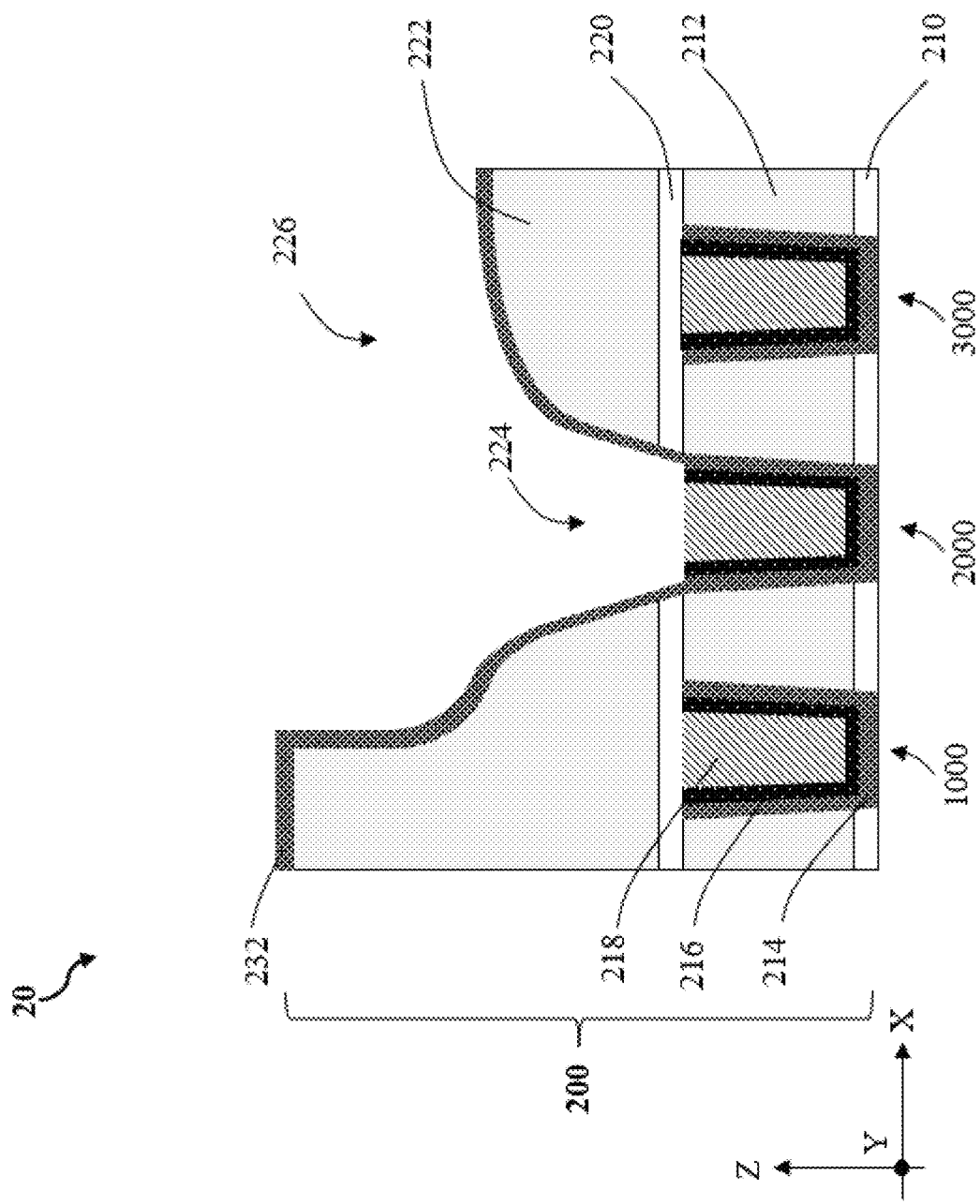
Figure 7B:
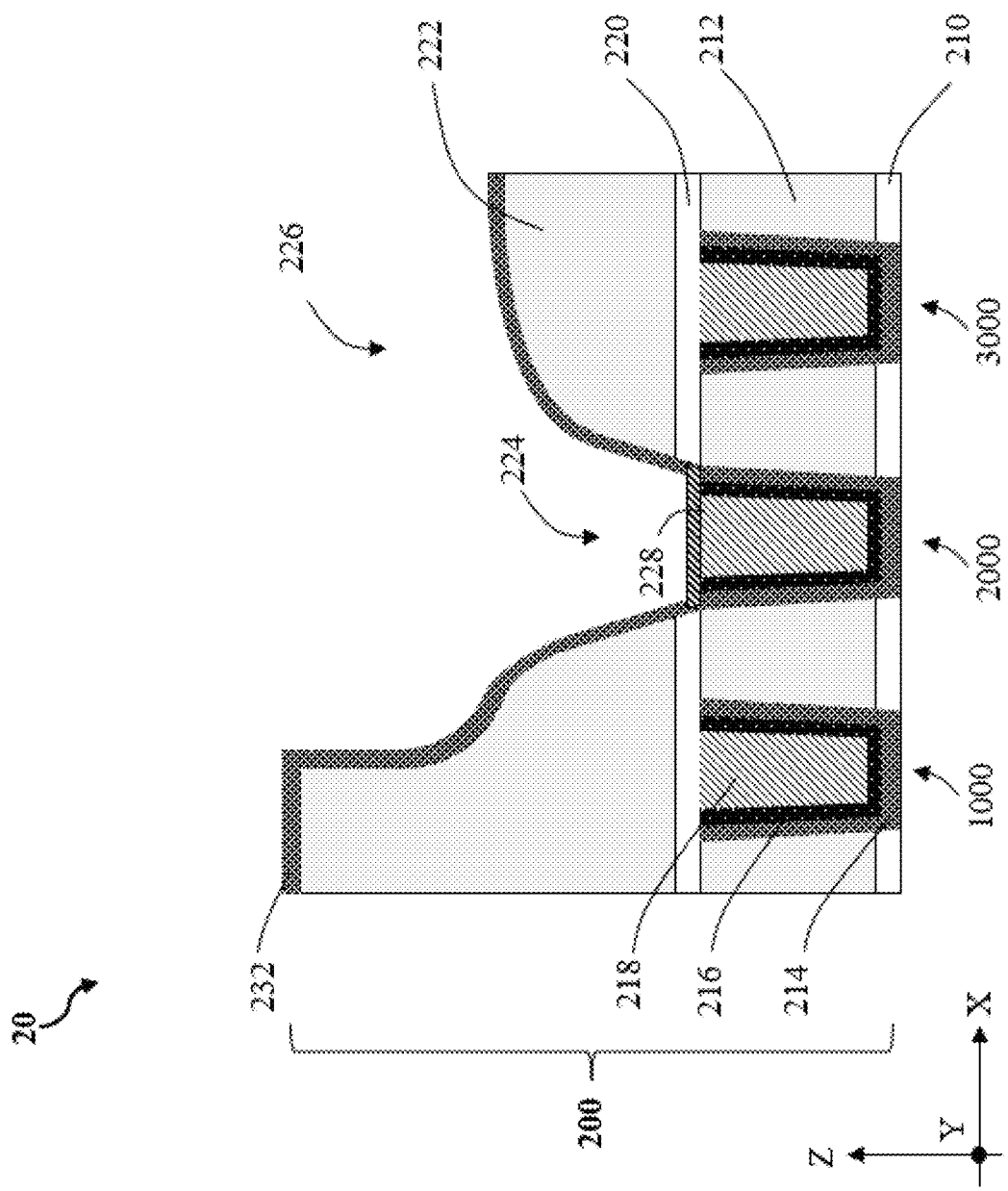
Figure 7C:
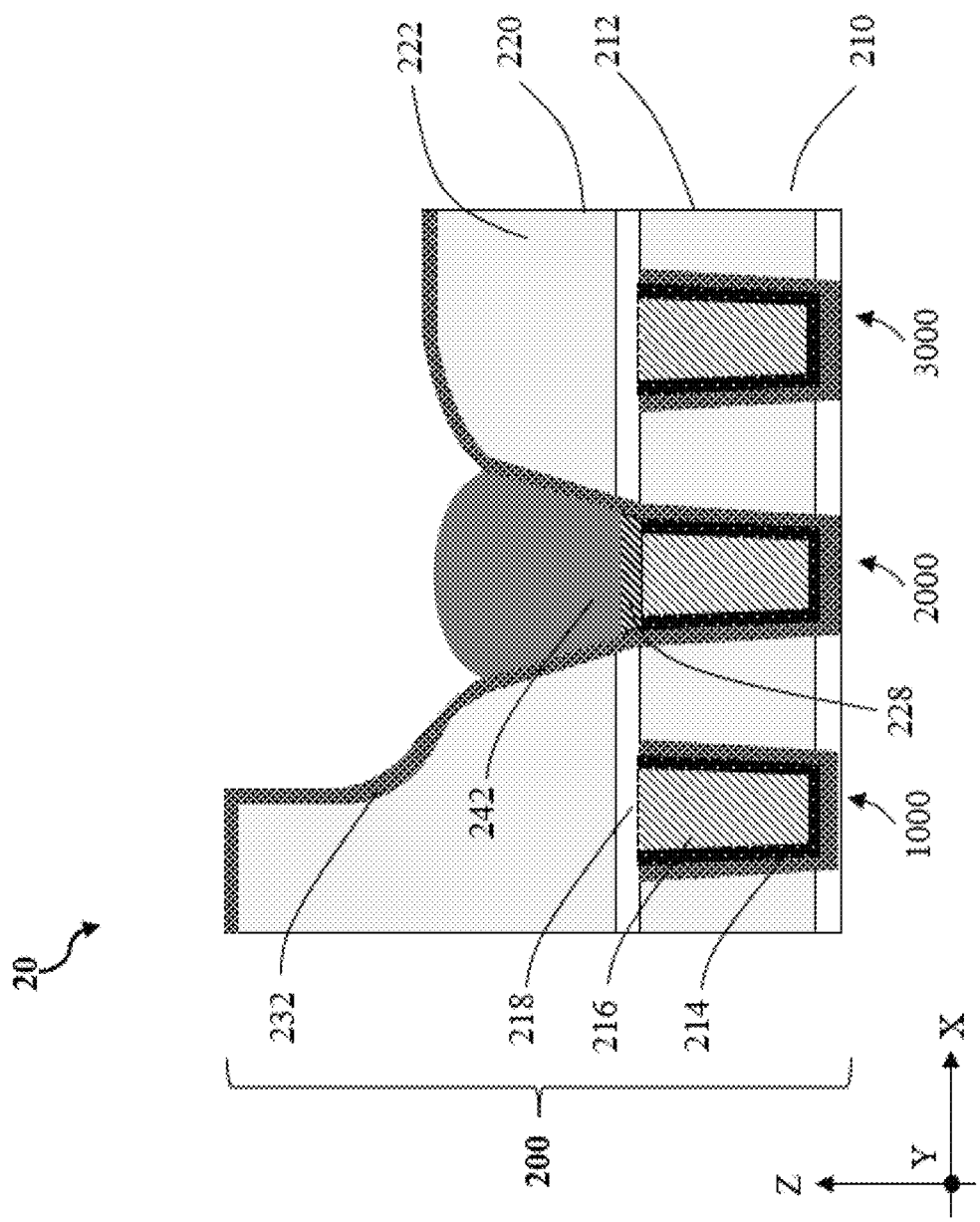

Referring to FIGS. 1A, 6A, 6B, 7A, and 7B, the method 100 include a block 112 where the SAM 230 is removed. In some embodiments, the SAM 230 may be removed by selective etching or annealing, such as the anneal operation 231 diagrammatically illustrated in FIGS. 6A and 6B. In some embodiments, the anneal operation 231 for removal of the SAM 230 may be performed at about 200° C. and about 400° C. As illustrated in FIG. 7A, in embodiments where the reset layer 228 is not formed, the contact feature 2000 is exposed after the SAM 230 is removed. In embodiments where the reset layer 228 is formed, the reset layer 228 is exposed after the SAM 230 is removed, as illustrated in FIG. 7B.

Referring to FIG. 1A, the method 100 may include a block 107 in place of blocks 106, 108, 110, and 112. At block 107, a self-aligned barrier layer may be selectively deposited over sidewalls of the second dielectric layer 222 to form a structure similar to but not identical to that shown in FIG. 7A. In those embodiments, precursors of the self-aligned barrier layer include a functional group that has a stronger affinity to the second dielectric layer 222 than to the contact features 2000 and can be used to selectively form the self-aligned barrier layer only on the second dielectric layer 222 in a suitable deposition process, such as CVD, ALD, electroless deposition, or spin-on coating. In some embodiments, the self-aligned barrier layer may include an oxygen-containing dielectric layer such as aluminum oxide or functional groups of self-assembled monolayer, such as APTES. Due to the self-alignment nature of the self-aligned barrier layer, the exposed contact features 2000 is substantially free of the self-aligned barrier layer upon conclusion of block 107. It is noted while FIG. 7A illustrates a similar structure, the composition of the first barrier layer 232 as shown in FIG. 7A is different from the composition of the self-aligned barrier layer.

Figure 8A:
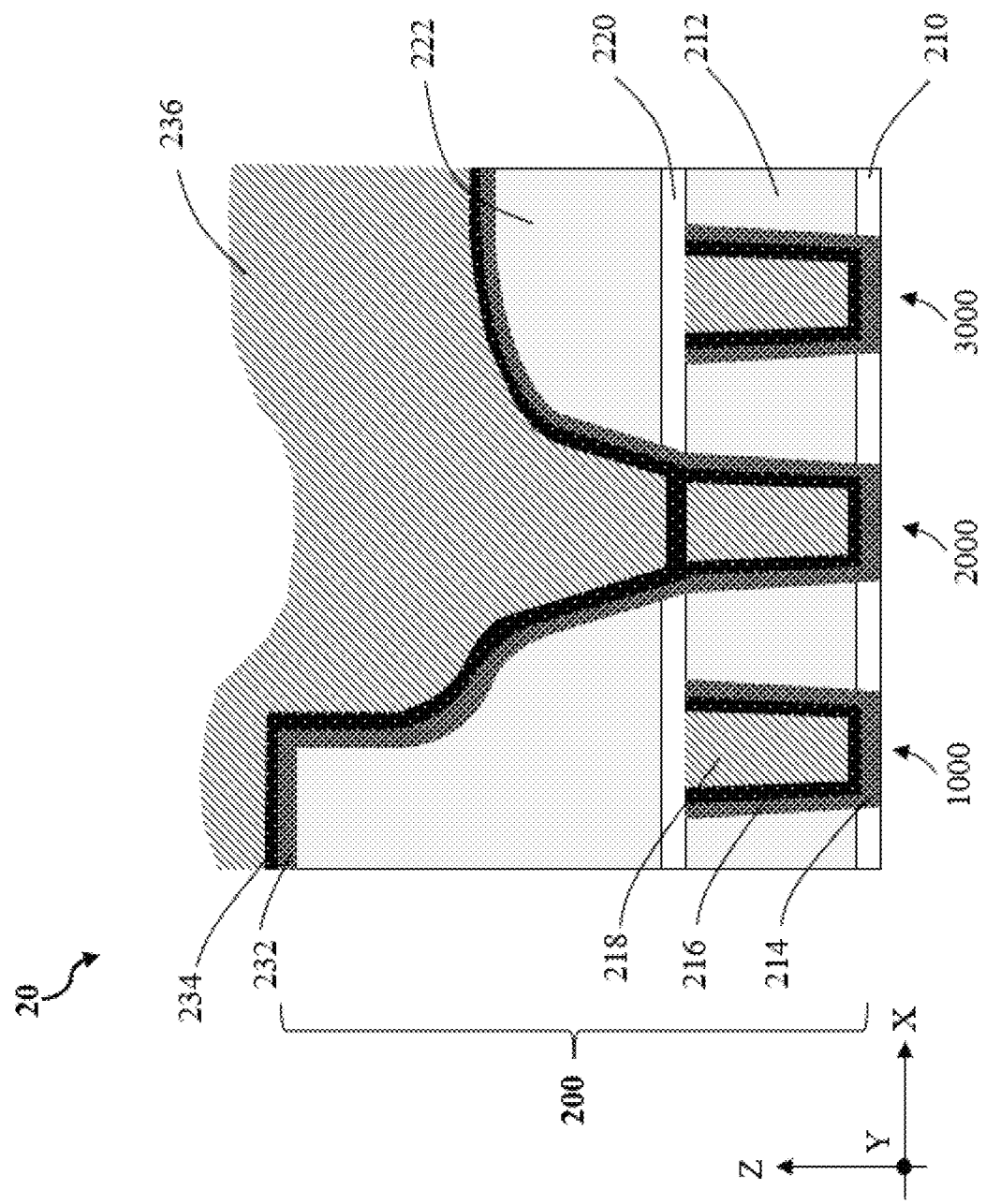
Figure 8B:
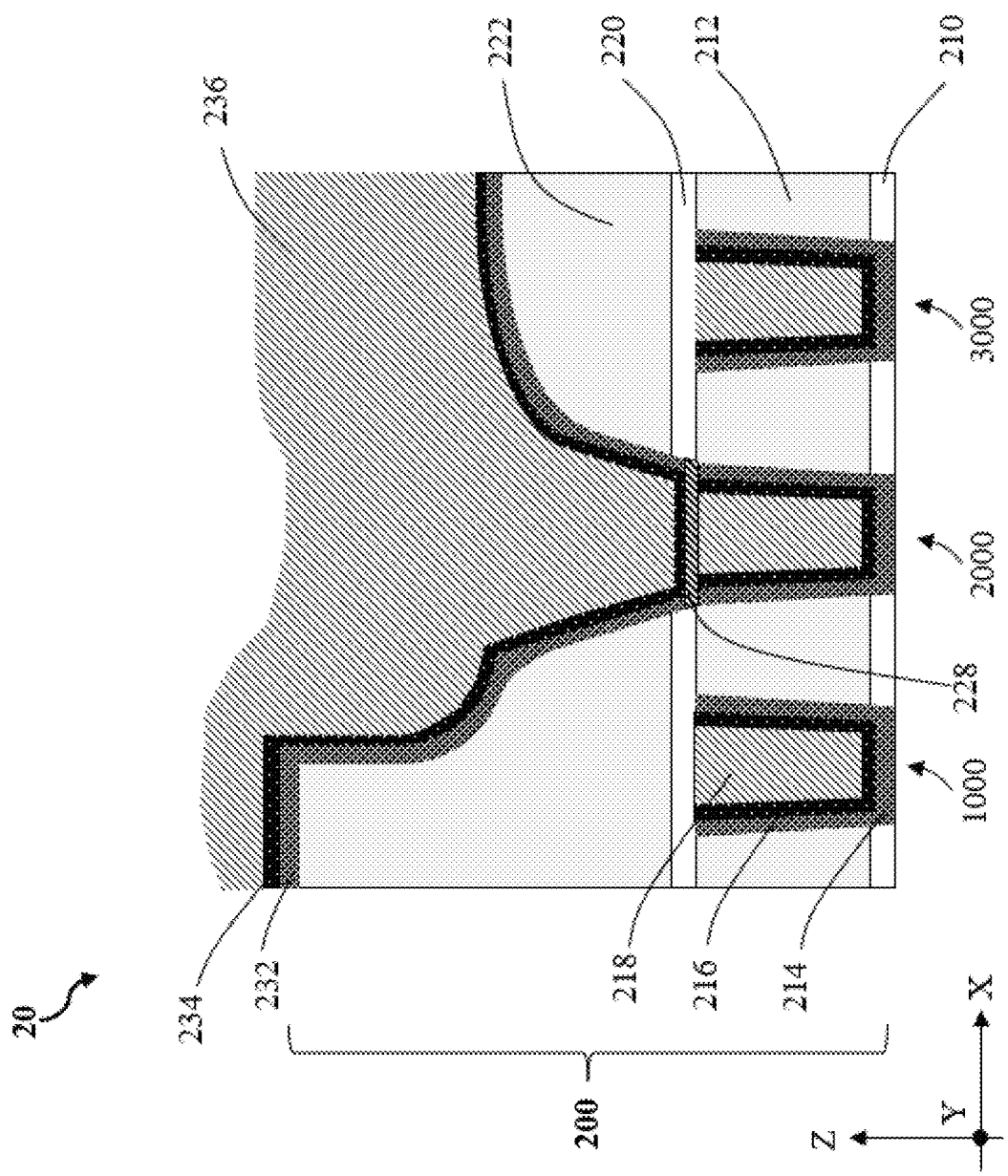

Referring to FIGS. 1B, 8A and 8B, the method 100 includes a block 114 where a first liner 234 is deposited over the contact feature 2000 and the first barrier layer 232. In some implementations, the first liner 234 may be deposited using ALD, CVD, ELD, or PVD and may be formed to a thickness between about 0.5 nm and 3 nm. The first liner 234 may be formed of suitable metal, metal nitride, or metal carbide, such as Co, CoN and RuN.

Referring still to FIGS. 1B, 8A and 8B, the method 100 includes a block 116 where a contact metal fill layer 236 is deposited over the first liner 234 to fill both the via opening 224 and the trench 226. The contact metal fill layer 236 may be formed of any suitable conductive material, such as W, Ru, Ni, Ta, Ti, Al, Cu, Co, TaN, TiN, and/or combinations thereof. As illustrated in FIG. 8A, an interface between the contact feature 2000 and the contact metal fill layer 236 includes the first liner 234 and is free or substantially free of the first barrier layer 232 that has a high resistance.

Referring to FIGS. 1B, 7C, 8C, and 9C, the method 100 may alternatively include block 113, 115, 117, and 119 in place of blocks 114 and 116. At block 113, a via metal fill layer 242 is deposited in the via opening 224. The via metal fill layer 242 may be formed of W, Ru, Ni, Ta, Ti, Al, Cu, Co, TaN, TiN, and/or combinations thereof and may be formed using PVD, CVD, ALD, electroplating, ELD, or other suitable deposition process, or combinations thereof. In some embodiments represented in FIGS. 7C, 8C and 9C, the via metal fill layer 242 is deposited on the reset layer 228. However, the present disclosure is not so limited and the via metal fill layer 242 may be deposited directly on the exposed contact feature 2000. In some implementations, the via metal fill layer 242 may be selectively deposited on the reset layer 228 or the contact feature 2000 in a bottom-up manner such that the via metal fill layer 242 selectively deposits in the via opening 224 along the Z direction without lodging on sidewalls of the trench 226. In some instances, the deposition of the via metal fill layer 242 may include one or more etch back operations to ensure quality of the via metal fill layer 242. Here, quality of the via metal fill layer 242 at least means low resistivity (or high conductivity) of the via metal fill layer 242. The etch back operations may prevent formation of voids or defects that may adversely impact the conductivity of the via metal fill layer 242. In the embodiments illustrated in FIGS. 7C, 8C and 9C, an interface between the via metal fill layer 242 and the contact feature 2000 is free of any barrier layer and may or may not include reset layer 228. It is noted that, in these alternative embodiments, no planarization is performed on the via metal fill layer 242 until the trench 226 above the via metal fill layer 242 is filled at blocks 115, 117 and 119. As a result, the top surface of the via metal fill layer 242 has a convex shape and is not planarized.

Figure 8C:
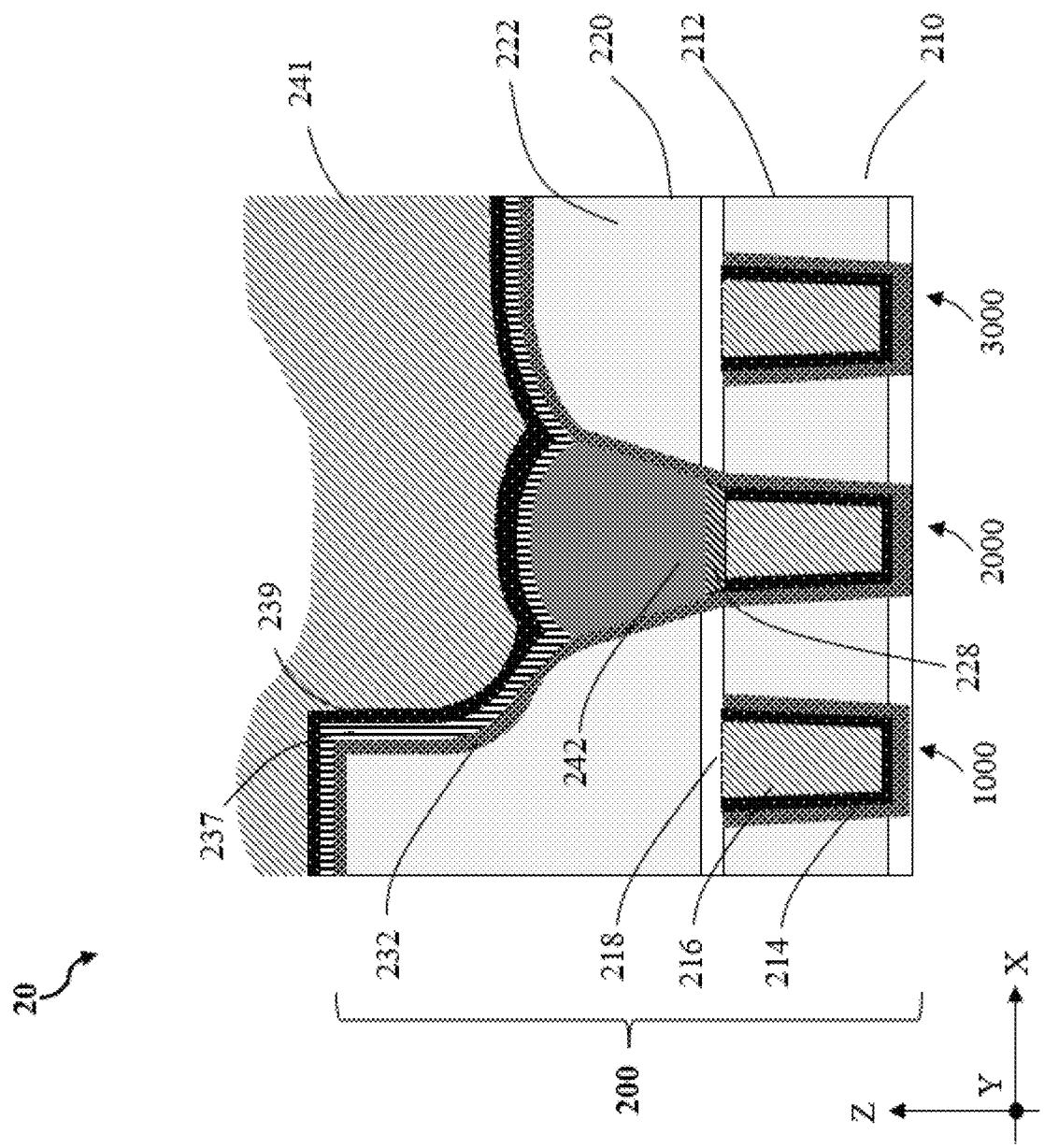
Figure 9A:
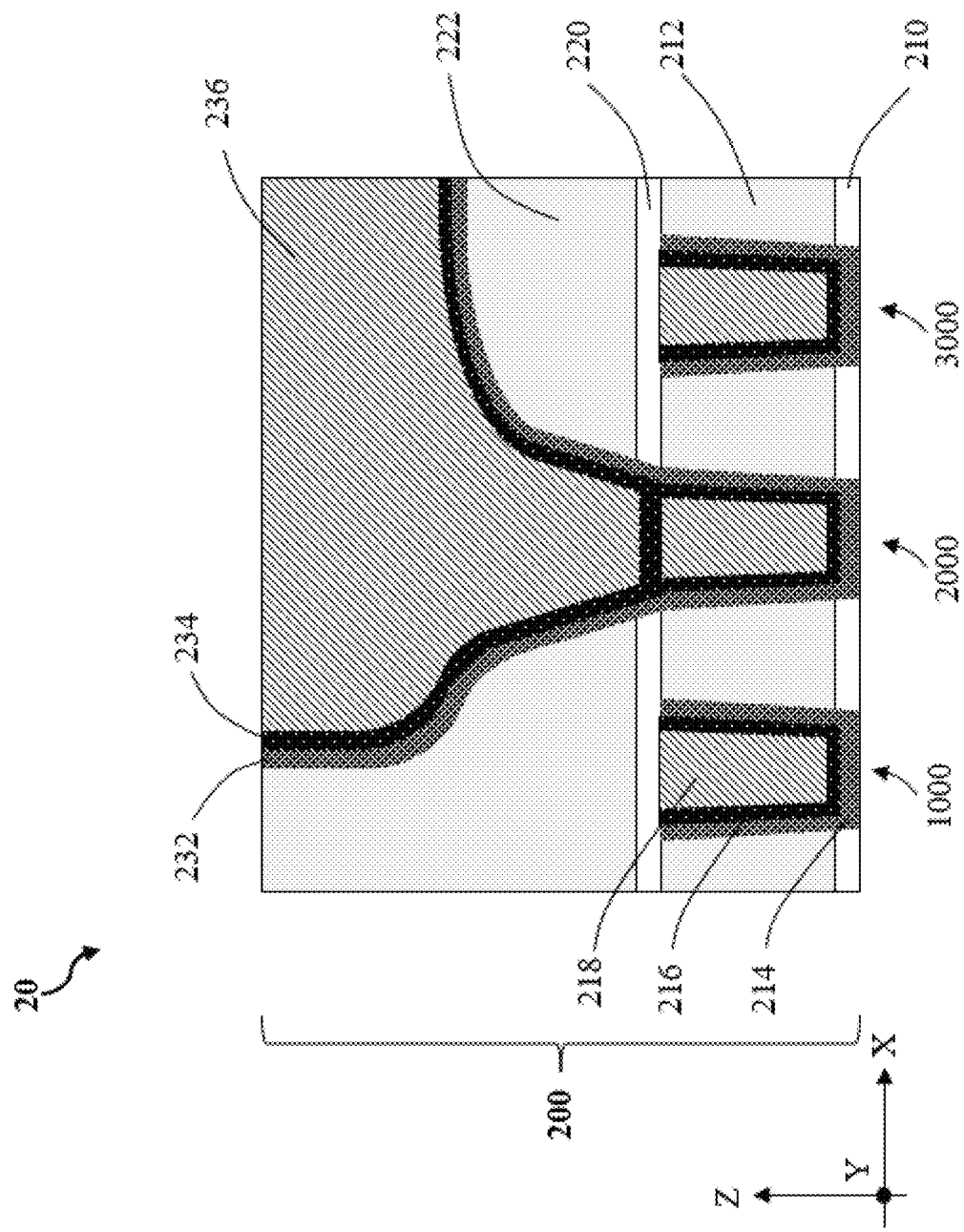
Figure 9B:
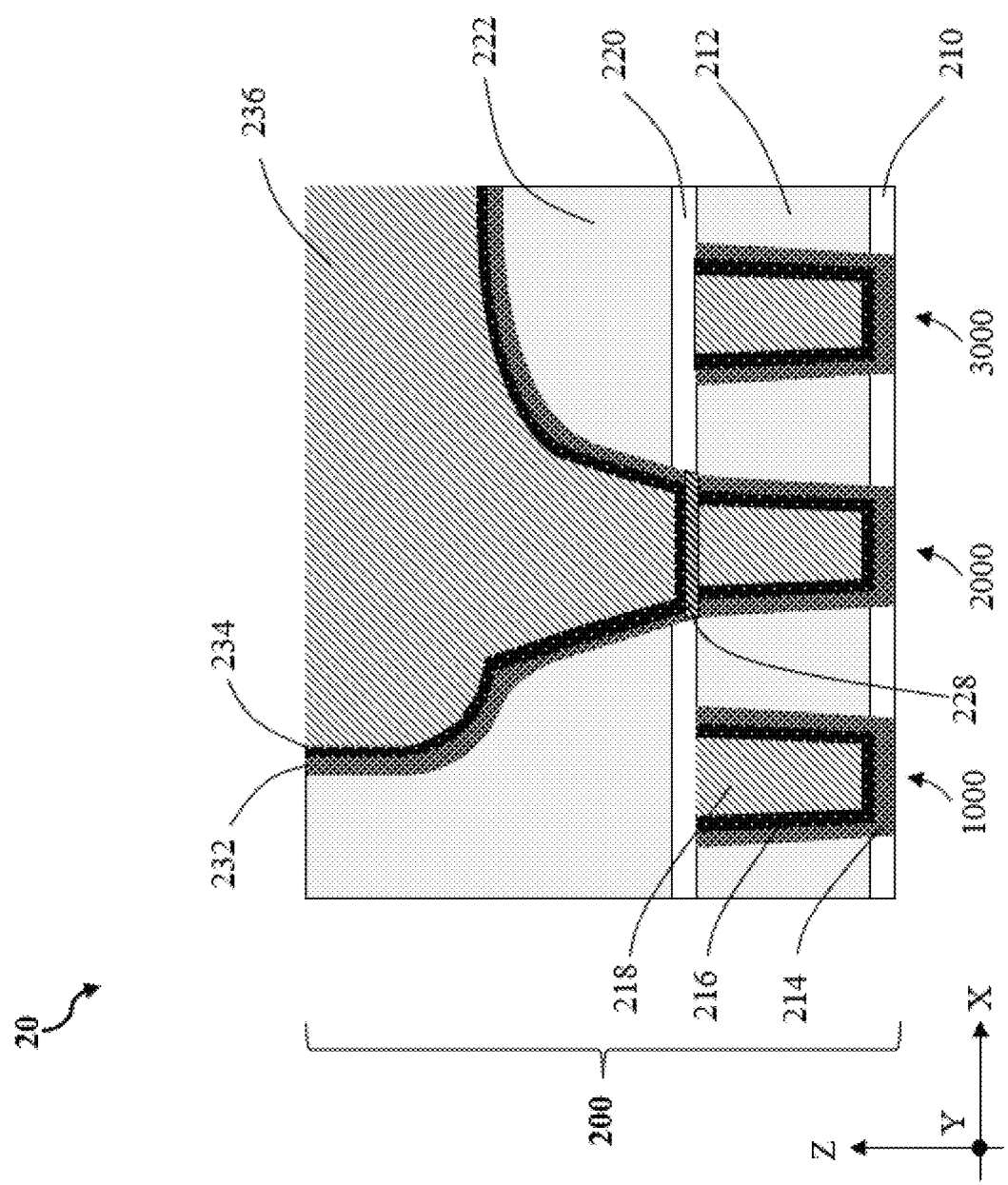
Figure 9C:
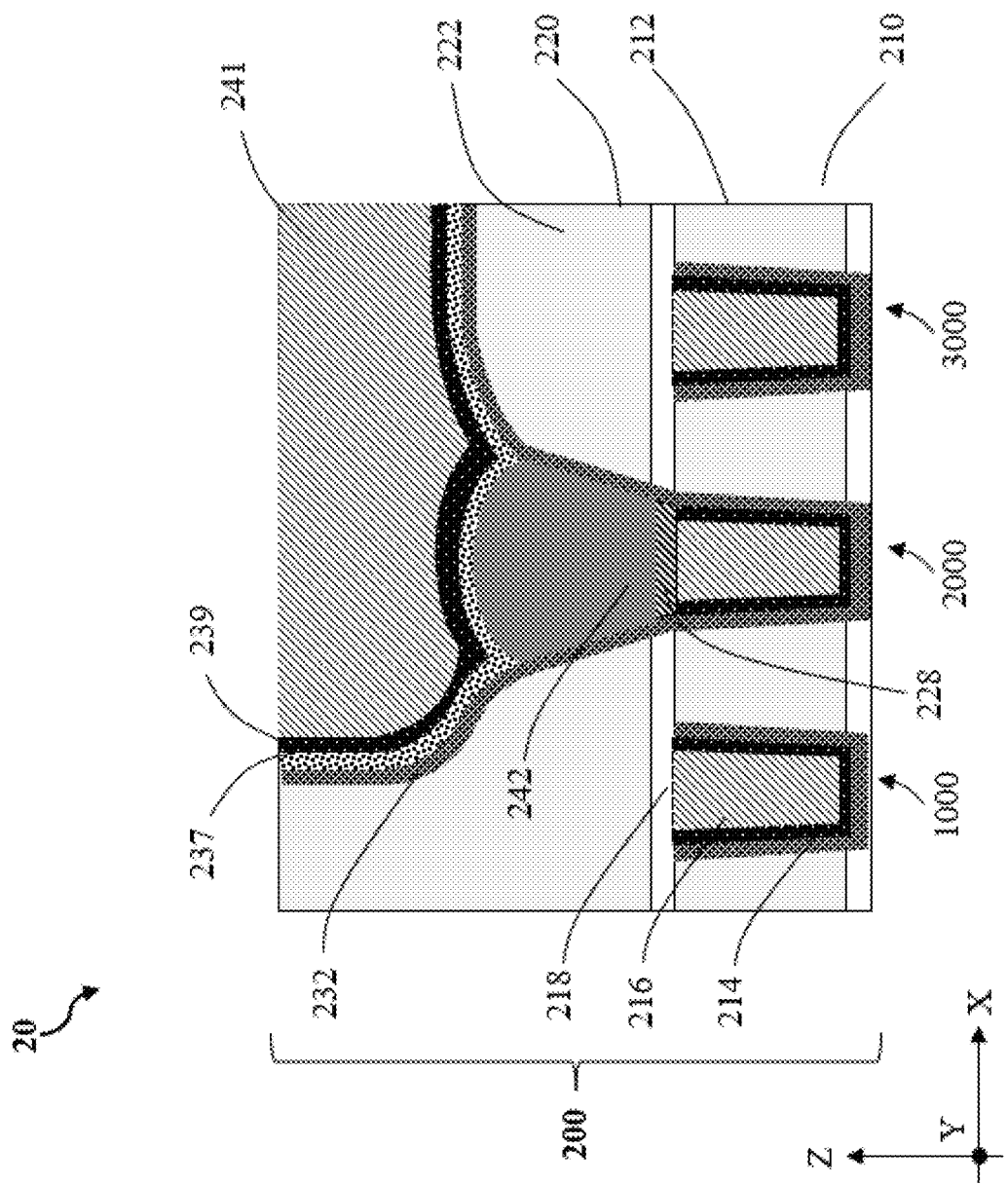

Referring to FIGS. 1B and 8C, the method 100 includes block 115 where the second barrier layer 237 is deposited over the via metal fill layer 242 and sidewalls of the trench 226. In some embodiments, the second barrier layer 237 may be formed of Ta, TaN, TaC, Ti, TiN, TiC, and other suitable material that can block oxygen diffusion, and may be deposited using ALD, CVD, or ELD to a thickness between about 0.5 nm and about 5 nm. In some embodiments represented in FIG. 8C, the second barrier layer 237 is conformally deposited on the first barrier layer 232 along sidewalls of the trench 226 and on the convex top surface of the via metal fill layer 242.

Referring still to FIGS. 1B and 8C, the method 100 includes block 117 where a second liner 239 is formed over the first barrier layer 232. In some implementations, the second liner 239 may be conformally deposited using ALD, CVD, ELD, or PVD on the second barrier layer 237 and may be formed to a thickness between about 0.5 nm and 3 nm. The second liner 239 may be formed of suitable metal, metal nitride, or metal carbide, such as Co, CoN and RuN.

Referring still to FIGS. 1B and 8C, the method 100 includes block 119 where the trench metal fill layer 241 is formed over the first liner 234. In some instances, the trench metal fill layer 241 may be deposited using PVD, CVD, ALD, electroplating, ELD, or other suitable deposition process, or combinations thereof. The trench metal fill layer 241 may be formed of any suitable conductive material, such as W, Ni, Ta, Ti, Al, Cu, Co, TaN, TiN, Ru, and/or combinations thereof. In embodiment illustrated in FIG. 3F, among other functions, the first barrier layer 232 and the first liner 234 may also function to prevent CMP slurry from penetrating/seeping through the interface between the via fill layer 242 and the second dielectric layer 222 to damage or corrode underlying structures, such as the contact feature 2000.

Referring to FIGS. 1B, 9A, 9B, and 9C, the method 100 includes block 120 where a planarization process, such as CMP, is performed. The operations at block 120 provide the interconnect structure 200 with a planar top surface such that additional interconnect structures may be formed thereon. In some embodiments, the operations at block 120 are performed after the operations at block 116 or after the operations at block 119.

Referring to FIG. 1B, the method 100 includes block 122 where further processes are performed. In some embodiments, the further processes may include processes for forming additional interconnect structures over the interconnect structure 200. For example, such further processes may include deposition of another CESL, deposition of another dielectric layer, formation of via openings, formation of trenches, deposition of barrier layers, deposition of liners, and deposition of metal fill layers.

Figure 10:
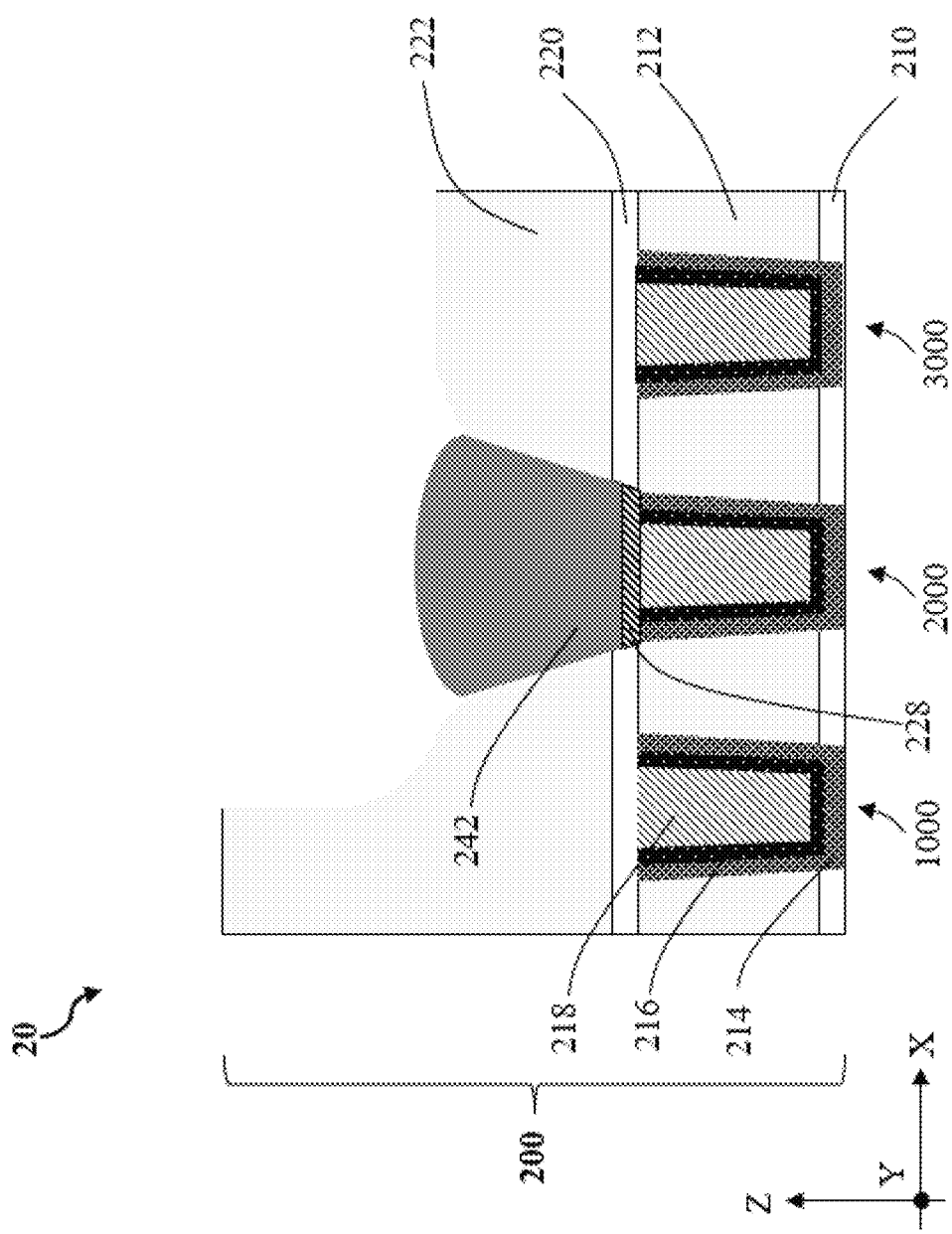
Figure 11:
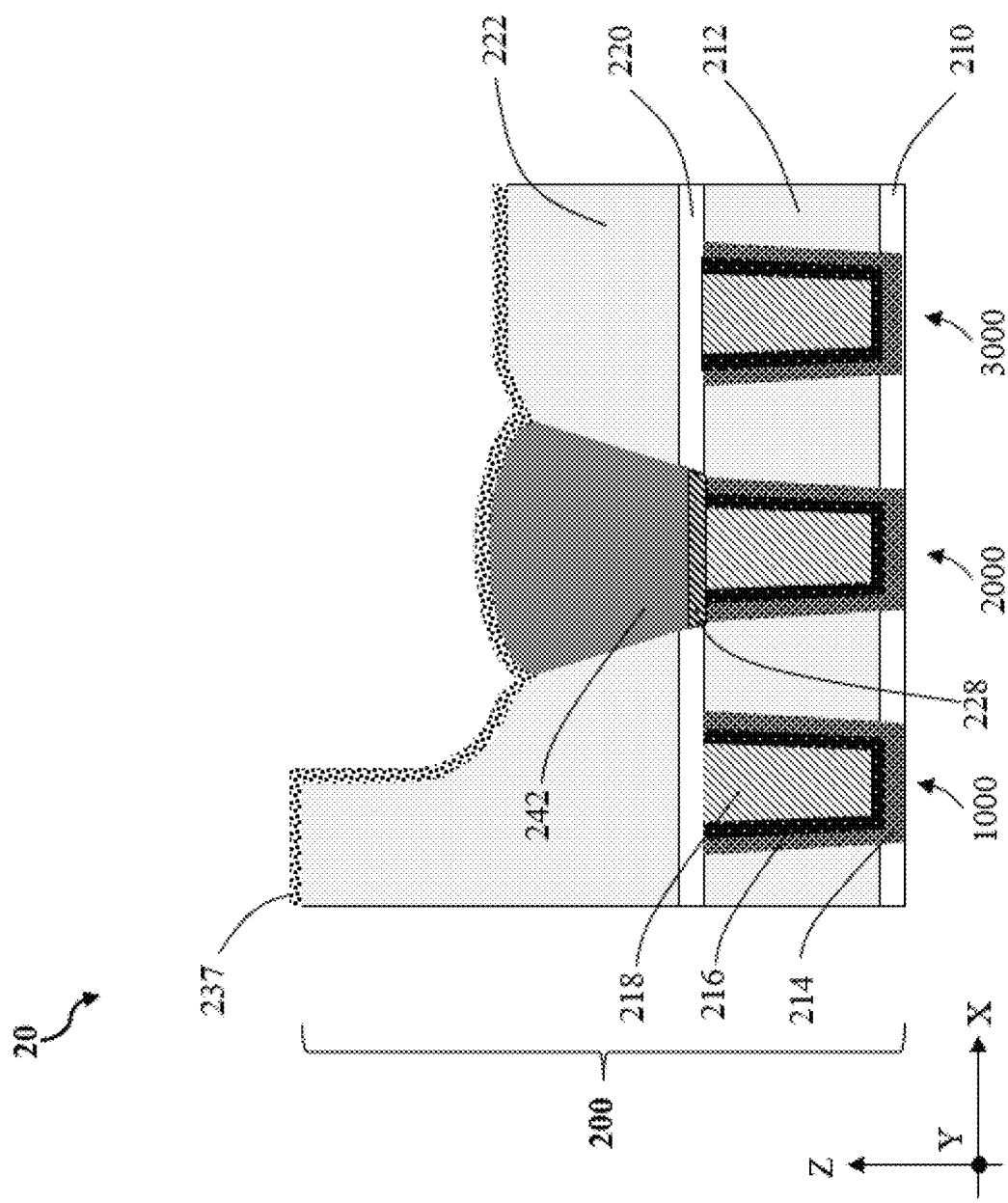
Figure 12:
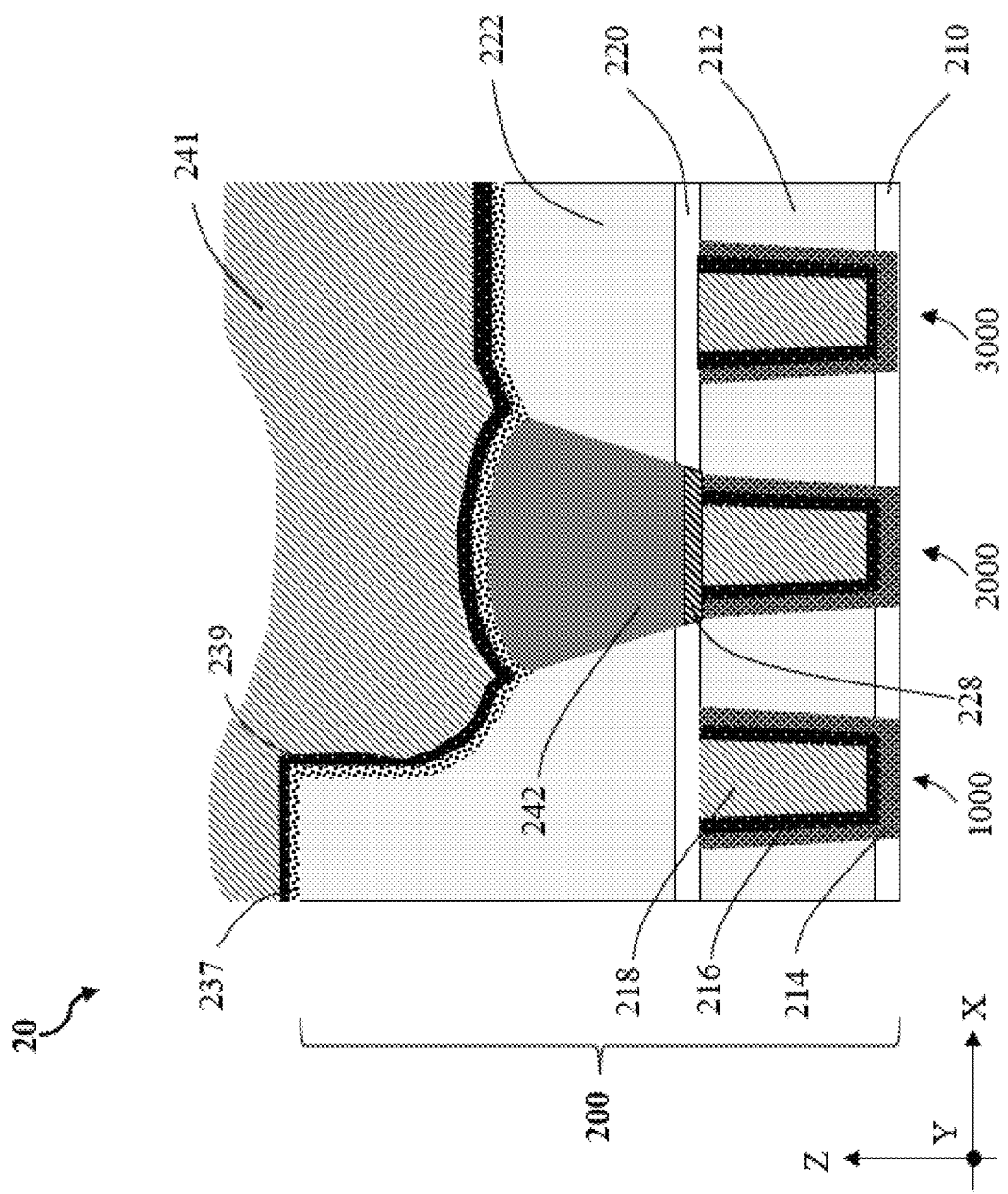
Figure 13:
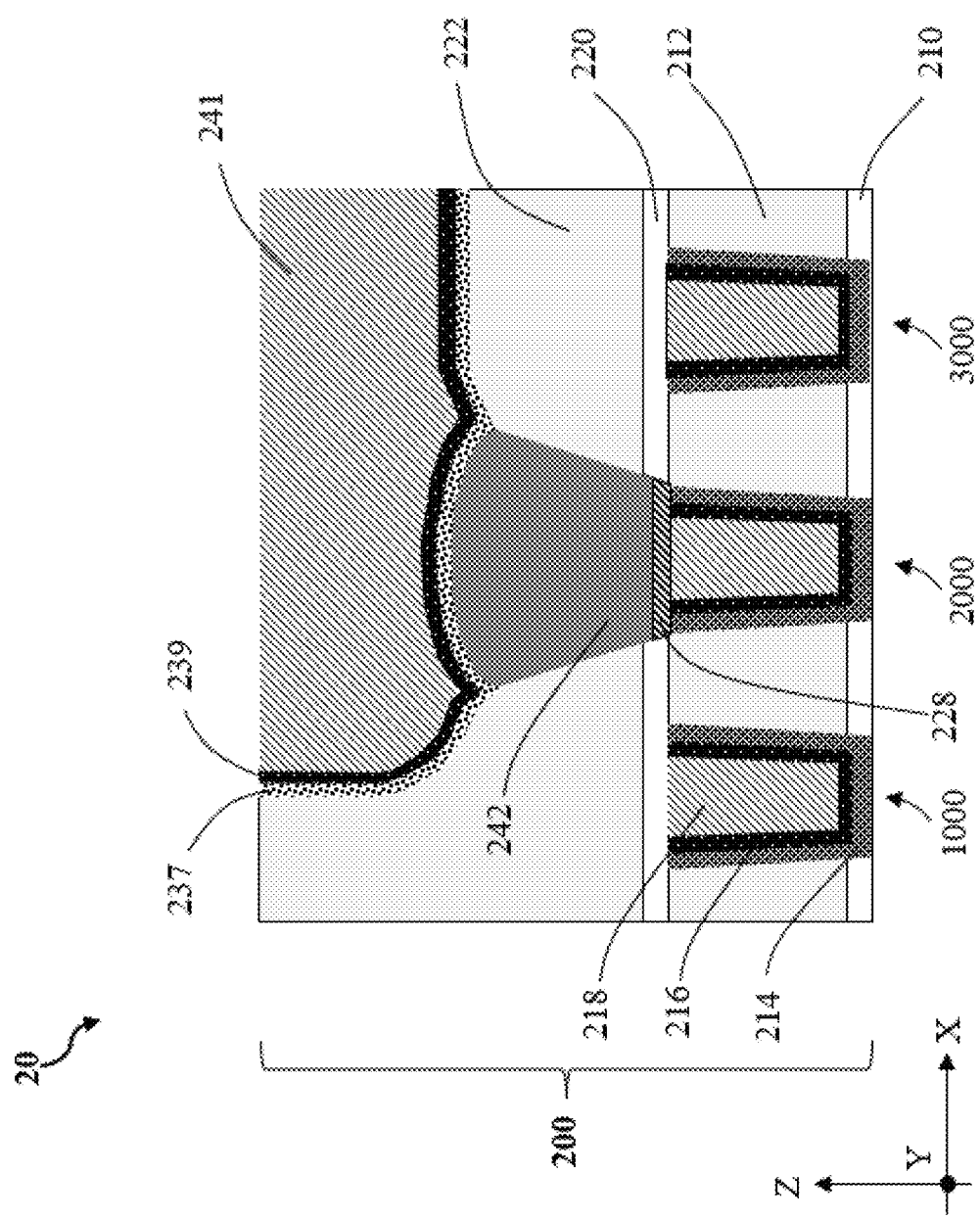

In still other alternative embodiments illustrated in FIGS. 10-13, the method 100 may deposit the via metal fill layer 242 without forming the first barrier layer 232 over sidewalls of the via opening 224 and the trench 226. In these embodiments, the via metal fill layer 242 is formed of tungsten, ruthenium, or other metal that is less susceptible to oxidation due to oxygen diffusion. In an implementation, after the reset layer 228 is deposited at block 106, the method 100 may proceed directly to blocks 113, 115, 117, and 119. In that example, the via metal fill layer 242 is deposited directly on the reset layer 228 and the second dielectric layer 222 along sidewalls of the via opening 224. The reset layer 228 here does not so much serve to reset the surface property of the contact feature 2000 but rather functions as an interfacial layer to promote adhesion of the via metal fill layer 242 to the contact feature 2000. While the reset layer 228 is illustrated in FIGS. 10-13, the present disclosure is not so limited and include embodiments where the reset layer 228 is omitted and the via metal fill layer 242 is formed directly on the exposed surface of the contact feature 2000. As illustrated in FIG. 10, similar to the operations at block 113, the via metal fill layer 242 is formed in a bottom-up manner and may have a convex top surface. The second barrier layer 237 in FIG. 11 may then be conformally deposited over sidewalls of the second dielectric layer 222 and the convex top surface of the via metal fill layer 242, in operations similar to those at block 115. The second liner 239 in FIG. 12 may be conformally deposited over the second barrier layer 237, in operations similar to those at block 117. Thereafter, the trench metal fill layer 241 in FIG. 12 may be deposited over the second liner 239, in operations similar to those at block 119. The top surface of the workpiece is then planarized using a suitable process, such as CMP, in operations similar to those at block 120. It is noted that the planarization does not apply directly to the via metal fill layer 242 that is not lined with any barrier layer but applies to the trench metal fill layer 241, the second liner 239, the second barrier layer 237, and the second dielectric layer 222. The second barrier layer 237 prevents any CMP (or planarization chemicals) from penetrating/seep through the interface between the via metal fill layer 242 and the second dielectric layer 222, thereby protecting the underlying contact features (such as contact feature 2000) from being damaged.

Figure 14A:
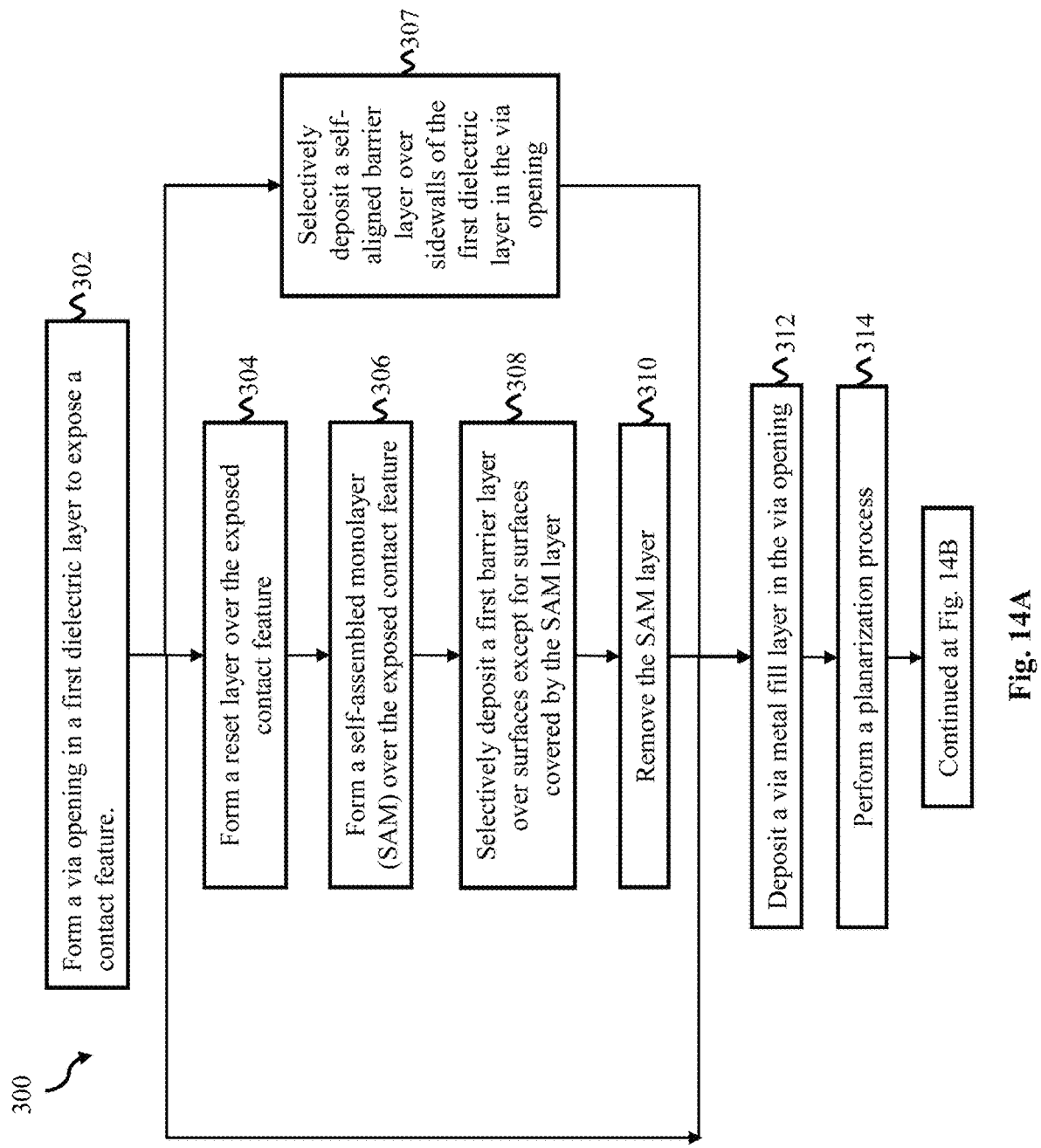

Reference is now made to FIGS. 14A and 14B, the present disclosure also provides a method 300 for fabricating a MEOL contact structure. Method 300 is described in conjunction with FIGS. 15, 16, 17A, 17B, 18A, 18B, 19A, 19B, 20A, 20B, 21A, 21B, 22A, and 22B, which are fragmentary cross-sectional views of an MEOL contact structure on a workpiece 400 at various stages of fabrication according to various embodiments of method 300 of the present disclosure. Additional steps can be provided before, during, and after method 300, and some of the steps described can be moved, replaced, or eliminated for additional embodiments of method 300. Additionally, operations in method 300 may bear resemblance to those in method 100 and some details may be omitted.

Figure 15:
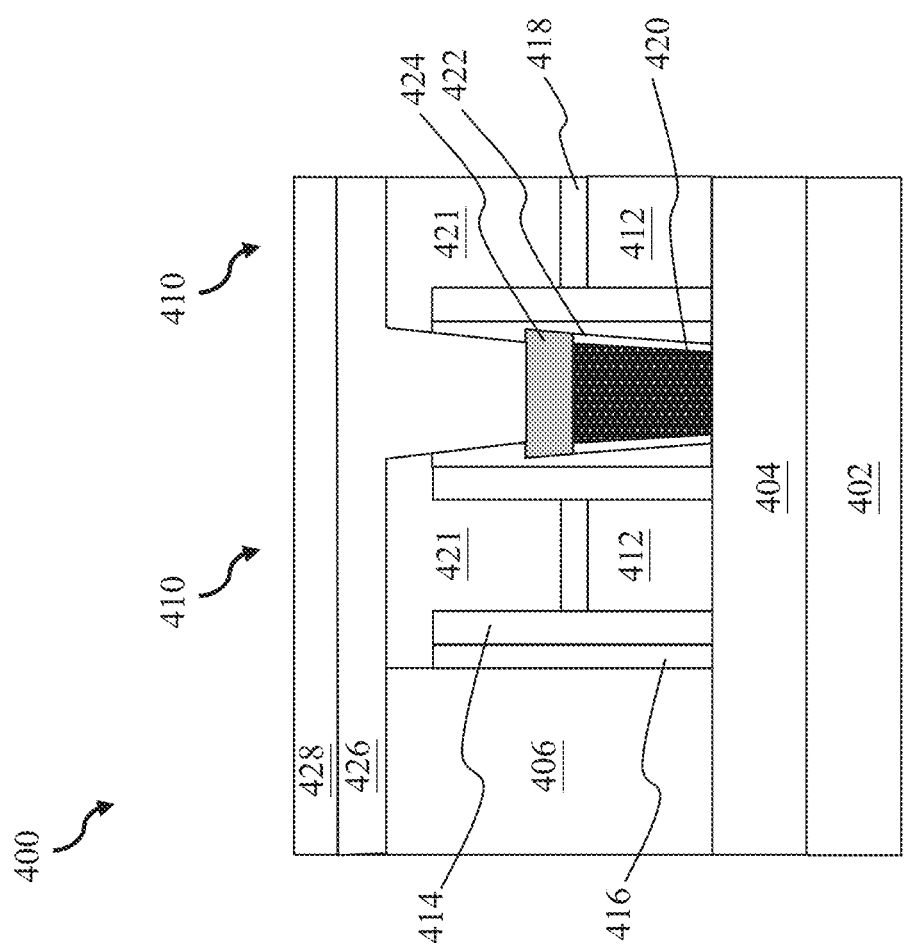

Referring now to FIGS. 14A, 15 and 16, the method 300 includes a block 302 where a via opening 430 is formed in a first dielectric layer 428 on a workpiece 400 to expose a contact feature, such as a source/drain contact capping layer 424. As illustrated in FIG. 15, the workpiece 400 includes a substrate 402, a fin structure 404, one or more gate structure 410 over channel regions of the fin structure 404, one or more source/drain contact 420 over source/drain region of the fin structure. As the substrate 402, fin structure 404, and gate structure 410 may be similar to substrate, fin structures, and gate structures described above in conjunction with FIG. 2, detailed descriptions thereof will not be repeated here. In some embodiments, each of the gate structures 410 includes a gate electrode 412, a gate capping layer 418, and a gate self-aligned contact (SAC) dielectric layer 421. In addition, one or more gate spacers may be formed over sidewalls of the gate structures 410. In the implementations shown in FIG. 15, a first spacer 414 is disposed on sidewalls of the gate structure 410 and a second spacer 416 is disposed over the first spacer 414. The source/drain contact 420 may be disposed between two gate structures 410 and may be lined with a barrier layer 422. In some implementations, the source/drain contact 420 is capped by a source/drain contact capping layer 424. In some instances, the gate capping layer 418 and the source/drain capping layer 424 may be formed of a metal nitride, such as titanium nitride (TiN), tantalum nitride (TaN), tungsten nitride (W2N), titanium silicon nitride (TiSiN), tantalum silicon nitride (TaSiN), or combinations thereof. In some embodiments, a source/drain contact SAC dielectric layer 426 may be formed over the source/drain capping layer 424. The source/drain contact SAC dielectric layer 426 may be formed of an oxygen-containing dielectric layer, such as silicon oxide, silicon oxynitride, or silicon oxycarbonitride. A first dielectric layer 428 is formed over the source/drain contact SAC dielectric layer 426. The first dielectric layer 428 in FIG. 15 is similar to the first and second dielectric layers 212 and 222 in FIG. 2 and detailed descriptions thereof will not be repeated. It is noted that while method 300 is described in association with formation of a contact structure electrically coupled to the source/drain contact 420 illustrated in FIGS. 15, 16, 17A, 17B, 18A, 18B, 19A, 19B, 20A, 20B, 21A, 21B, 22A, and 22B, a person of ordinary skill in the semiconductor art would appreciate that method 300 is applicable to formation of a contact structure electrically coupled to the gate electrode 412.

Referring to FIGS. 14A and 17A, the method 300 may skip from block 302 directly to block 312 where a via metal fill layer 432 is deposited in the via opening 430 in a bottom-up manner using CVD, ALD, or other suitable method. The via metal fill layer 432 is in direct contact with exposed sidewalls of the first dielectric layer 428 and the source/drain contact SAC dielectric layer 426 and is not protected by any barrier layer that may block oxygen diffusion. In some embodiments, the via metal fill layer 432 may be formed of a metal that is less susceptible to oxidation. In some instances, the via metal fill layer 432 may include tungsten, ruthenium, or other suitable metal.

Referring to FIGS. 14A and 17B, the method 300 includes a block 304 where a reset layer 425 is optionally formed over the exposed source/drain contact capping layer 424. As described above with respect to method 100, the reset layer 425 may or may not be needed to provide a surface for attachment to the SAM layer to be formed in block 306. At block 306, a SAM layer (not shown) is formed over the source/drain contact capping layer 424. In embodiments where the reset layer 425 is formed, the SAM layer is formed on the reset layer 425. In other embodiments where the reset layer 425 is not formed, the SAM is formed on the source/drain contact capping layer 424. As the SAM layer formed over the source/drain contact capping layer 424 prevents deposition of the first barrier layer 434, at block 308 of the method 300, the first barrier layer 434 is selectively deposited on exposed sidewalls of the source/drain contact SAC dielectric layer 426 and exposed sidewalls of the first dielectric layer 428. The method 300 also includes a block 310 where the SAM layer is removed.

Referring to FIG. 14A, in some alternative embodiments, the method 300 may include a block 307 in place of blocks 304, 306, 308, and 310. The block 307 of the method 300 includes selectively depositing a self-aligned barrier layer over sidewalls of the via opening 430. In those alternative embodiments, precursors of the self-aligned barrier layer include a functional group that has a stronger affinity to the first dielectric layer 428 and the source/drain contact SAC dielectric layer 426 than to the source/drain contact capping layer 424 and can be used to selectively form the self-aligned barrier layer only on sidewalls of the via opening 430 in a suitable deposition process, such as CVD or ALD. In some embodiments, the self-aligned barrier layer may include an oxygen-containing dielectric layer such as aluminum oxide or functional groups of self-assembled monolayer, such as APTES. Due to the self-alignment nature of the self-aligned barrier layer, the exposed source/drain contact capping layer 424 is substantially free of the self-aligned barrier layer upon conclusion of block 307. The resulting structure is different from the structure shown in FIG. 17B in that the reset layer 425 is omitted and the self-aligned barrier layer has a composition different from the composition of the first barrier layer 434. In some implementations, the self-aligned barrier layer is selected such that it has smaller oxygen out-diffusion than silicon oxide. Additionally, in some implementations, a liner that is similar to the liner 216 described above may be deposited over the self-aligned barrier layer to improve interfacial adhesion and to prevent oxygen diffusion.

Referring to FIGS. 14A and 17B, the method 300 may proceed from block 310 to block 312 where a metal fill layer 436 is deposited in the via opening 430. In some embodiments, the metal fill layer 436 may be formed of any suitable conductive material, such as W, Ni, Ta, Ti, Al, Cu, Co, TaN, TiN, and/or other suitable conductive materials.

Figures 18A, 18B:
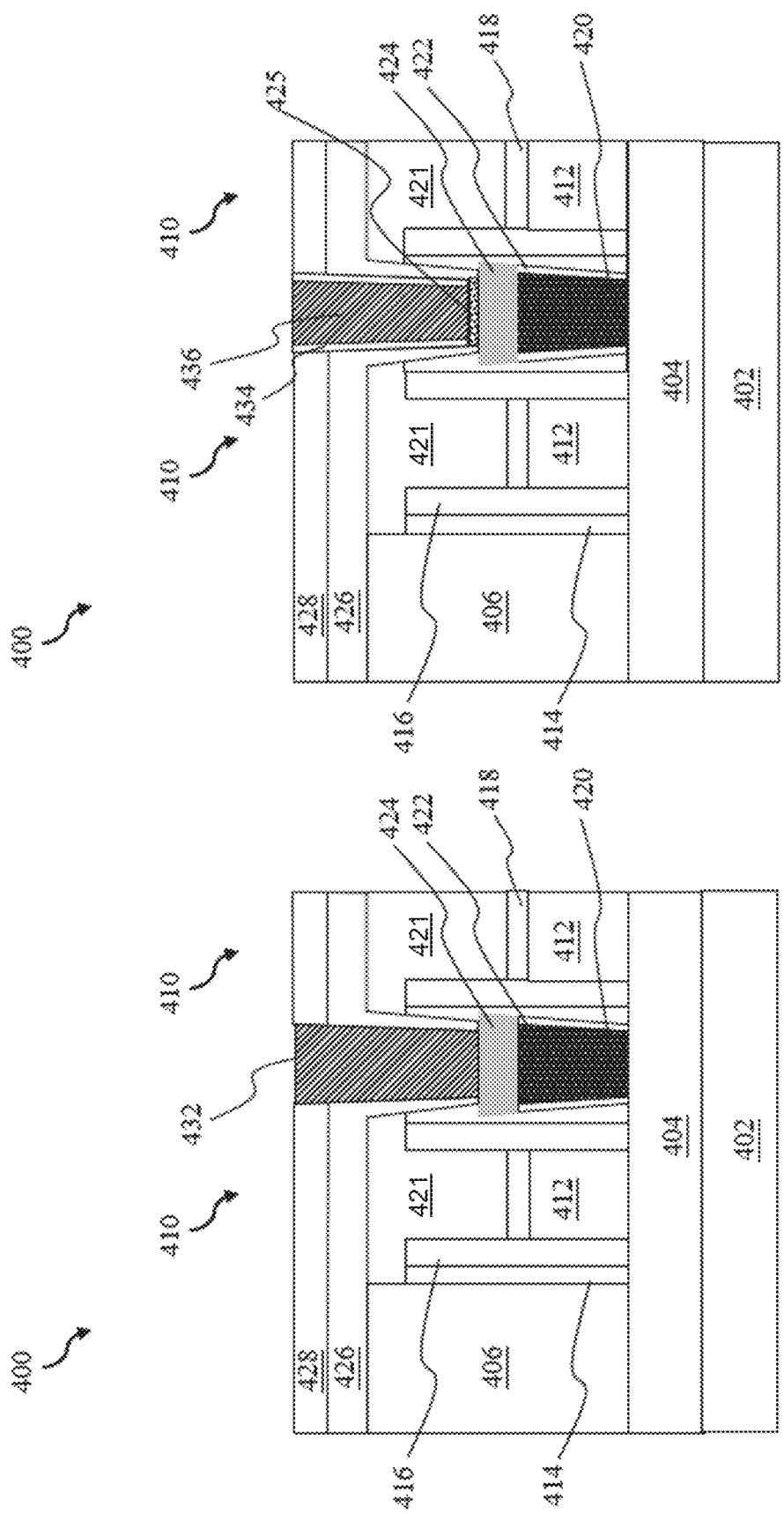

Referring now to FIGS. 14A, 18A and 18B, the method 300 includes a block 314 where a planarization process is performed such that the first barrier layer 434 and the metal fill layer 436 formed over top surfaces of the first dielectric layer 428 are removed. With respect to the embodiments represented in FIG. 18A, top surfaces of the first dielectric layer 428 and the metal fill layer 432 are coplanar. With respect to the embodiments represented in FIG. 18B, top surfaces of the first dielectric layer 428, the first barrier layer 434, and the metal fill layer 436 are coplanar.

Referring to FIGS. 14B, 19A and 19B, the method 300 includes a block 316 where a second dielectric layer 438 is deposited over the via metal fill layer 432 shown in FIG. 19A or the via metal fill layer 436 in FIG. 19B. The second dielectric layer 438 may be similar to the first and second dielectric layers 212 and 222 in FIG. 2 and detailed descriptions thereof will not be repeated. In some instances, a planarization process may be performed to provide the second dielectric layer 438 with a planarized top surface.

Referring to FIGS. 14B, 20A, and 20B, the method 300 includes a block 318 where a trench 440 is formed in the second dielectric layer 438 to expose the via metal fill layer 432 in FIG. 20A or the via metal fill layer 436 (along with top surfaces of the first barrier layer 434) in FIG. 20B.

Referring to FIGS. 14B and 21A, the method 300 may proceed from block 318 to block 323 where a self-aligned barrier layer 444 is formed over sidewalls of the second dielectric layer in the trench 440. The formation and composition of the self-aligned barrier layer 444 has been described above and will not be repeated here. As illustrated in FIG. 21, the self-aligned barrier layer 444 is only formed on surfaces of the first dielectric layer 428 and the second dielectric layer 438. The top surface of the via metal fill layer 432 is substantially free of the self-aligned barrier layer 444. In some implementations, a liner that is similar to the liner 216 described above may be deposited over the self-aligned barrier layer 444 to improve interfacial adhesion and to prevent oxygen diffusion.

Referring to FIGS. 14B and 21B, the method 300 may proceed from block 318 to block 320 where a reset layer 442 is formed over the exposed via metal fill layer 436. From block 318, the method 300 may proceed to block 322 where a SAM layer (not shown) is formed over the exposed via metal fill layer 436 for the purposes of selective deposition of a second barrier layer 446 in block 324. Then, at block 324 of the method 300, a second barrier layer 446 is selectively deposited over surfaces except for surfaces covered by the SAM layer. After the selective deposition of the second barrier layer 446, the method 300 includes a block 326 where the SAM layer is removed. In some implementations, after the SAM layer is removed, a liner that is similar to the liner 216 described above may be deposited over the second barrier layer 446 if the liner may further improve interfacial adhesion or prevent oxygen diffusion.

Referring now to FIGS. 14B, 22A and 22B, the method 300 may proceed from either block 323 or block 328 to a block 328 where a trench metal fill layer 448 is formed over the self-aligned barrier layer 444 in FIG. 22A or the second barrier layer 446 in FIG. 22B. As illustrated in FIGS. 22A and 22B, the method 300 includes a block 330 where a planarization process is performed to provide planar top surfaces.

The interconnect structures, contact structures and method disclosed herein provide several benefits. In some embodiments, by either use of a SAM to block formation of a barrier layer or a self-aligned barrier layer, the interface between different contact features or different interconnect layers is free of any barrier layer while sidewalls of the contact vias and trenches are lined by barrier layers. In those embodiments, the barrier layer prevents diffusion of oxygen from dielectric layers but stays out of the conduction path to reduce resistance. In some other embodiments where a via opening is exposed on a bottom surface of a trench, the via metal fill layer is selectively deposited in the via opening in a bottom-up manner and a barrier-lined metal line is formed in the trench. In these embodiments, the barrier-lined metal line over the contact via prevent harmful process chemicals, such as CMP slurries, from seeping or penetrating through the interface between the contact via and the dielectric layer surrounding the contact via. The barrier-lined metal line therefore can protect underlying structures from being damaged by process chemicals.

The present disclosure provides for many different embodiments. In one embodiment, an interconnect structure is provided. The interconnect structure includes a first contact feature in a first dielectric layer, a second dielectric layer over the first dielectric layer, a second contact feature over the first contact feature, a barrier layer between the second dielectric layer and the second contact feature, and a liner between the barrier layer and the second contact feature. An interface between the first contact feature and the second contact feature includes the liner and is free of the barrier layer.

In some embodiments, the barrier layer includes tantalum, tantalum nitride, tantalum carbide, titanium, titanium nitride, titanium carbide, or combinations thereof. In some embodiment, the liner includes cobalt, cobalt nitride, ruthenium nitride, or combinations thereof. In some embodiments, the interconnect structure further includes a conductive layer between the liner and the first contact feature. In some implementations, the conductive layer includes ruthenium or tungsten. In some instances, the second contact feature includes a first conductive material and the conductive layer includes a second conductive material different from the first conductive material. In some implementations, the first conductive material includes nickel, tantalum, titanium, aluminum, copper, cobalt, ruthenium, and tungsten.

In another embodiment, an interconnect structure is provided. The interconnect structure includes a first contact feature in a first dielectric layer, a second contact feature in a second dielectric layer over the first dielectric layer. The second contact feature includes a contact via portion, a conductive line portion, and a second barrier layer. The contact via portion includes a reset layer directly on the first contact feature and a first metal fill layer over the reset layer. The conductive line portion includes a first barrier layer over the first metal fill layer, a liner over the first barrier layer, and a second metal fill layer over the liner. The second barrier layer is disposed between the second contact feature and the second dielectric layer. In some embodiments, the first barrier layer includes tantalum, tantalum nitride, tantalum carbide, titanium, titanium nitride, titanium carbide, or combinations thereof. In some embodiments, the second barrier layer comprises tantalum, tantalum nitride, tantalum carbide, titanium, titanium nitride, titanium carbide, or combinations thereof. In some embodiments, the liner includes cobalt, cobalt nitride, ruthenium nitride, or combinations thereof. In some instances, the reset layer includes cobalt or ruthenium. In some implementations, the first contact feature includes a first conductive material and the reset layer includes a second conductive material different from the first conductive material. In some instances, the first contact feature and the second metal fill layer are formed of the same conductive material. In some embodiments, a top surface of the conductive line portion is planar and a top surface of the contact via portion is convex in shape.

In still another embodiment, a method is provided. The method includes forming a first contact feature in a first dielectric layer; forming a via opening and a trench in a second dielectric layer over the first dielectric layer; selectively forming a first barrier layer over sidewalls of the via opening and the trench such that a top surface of the first contact feature is free of the first barrier layer; depositing a liner within the via opening and the trench; and depositing a first metal fill layer over the liner.

In some implementations, the selectively forming of the first barrier layer includes depositing a self-assembled monolayer (SAM) on the first contact feature; depositing the first barrier layer over sidewalls of the via opening using a precursor; and performing an anneal to remove the SAM. The SAM repels the precursor. In some instances, the selectively forming of the first barrier layer includes depositing a reset layer over the first contact feature; and depositing a self-assembled monolayer (SAM) on the reset layer. In some embodiments, the method further includes after the forming of the first barrier layer and before the depositing of the liner, depositing a second metal fill layer over the first contact feature. In some instances, the method further includes depositing a second barrier layer over the liner.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    receiving a workpiece that includes:
        a first gate electrode and a second gate electrode,
        a first spacer disposed along a sidewall of the first gate electrode,
        a first gate dielectric capping layer disposed over top surfaces of the first gate electrode and the first spacer,
        a second spacer disposed along a sidewall of the second gate electrode,
        a second gate dielectric capping layer disposed over top surfaces of the second gate electrode and the second spacer,
        a contact feature disposed between the first spacer and the second spacer along a direction,
        a self-aligned contact (SAC) dielectric layer disposed over the first gate dielectric capping layer, the second gate dielectric capping layer, and the contact feature, a portion of the SAC dielectric layer extending between the first spacer and the second spacer as well as between the first gate dielectric capping layer and the second gate dielectric capping layer along the direction, wherein the portion of the SAC dielectric layer is in direct contact with a sidewall of the first gate dielectric capping layer and a sidewall of the second gate dielectric capping layer, and
        a first dielectric layer over the SAC dielectric layer;
    forming a via opening through the first dielectric layer and the portion of the SAC dielectric layer to expose the contact feature, wherein a portion of the via opening is disposed between a sidewall of the first spacer and a sidewall of the second spacer;
    after the forming of the via opening, forming a first reset layer over the exposed contact feature;
    depositing a first self-assembled monolayer (SAM) layer on the first reset layer;
    after the depositing of the first SAM layer, selectively depositing a first barrier layer on surfaces other than surfaces of the first SAM layer;
    removing the first SAM layer;
    depositing a via metal fill layer in the via opening to couple to the first reset layer;
    depositing a second dielectric layer over the via metal fill layer;
    forming a trench in the second dielectric layer to expose the via metal fill layer;
    after the forming of the trench, forming a second reset layer over the exposed via metal fill layer;
    depositing a second SAM layer over the second reset layer;
    after the depositing of the second SAM layer, selectively depositing a second barrier layer on surfaces other than surfaces of the second SAM layer;
    removing the second SAM layer; and
    depositing a trench metal fill layer over the trench.

2. The method of claim 1, wherein the first reset layer and the second reset layer comprise cobalt or ruthenium.

3. The method of claim 1,
    wherein the first SAM layer the second SAM layer comprise a molecule that includes a head group and a tail group,
    wherein the head group comprises phosphorus (P), sulfur (S), or silicon (Si) and the tail group comprises a carbon chain.

4. The method of claim 3, wherein the molecule comprises ODPA (Octadecylphosphonic), organosulfurs, dodecanethiol, alkanethiol, or 3-aminopropyl)triethoxysilane (APTES).

5. The method of claim 1,
    wherein the contact feature comprises a source/drain contact and a source/drain contact capping layer disposed on the source/drain contact,
    wherein the forming of the via opening exposes the source/drain contact capping layer.

6. The method of claim 5, wherein the source/drain contact capping layer comprises titanium nitride (TiN), tantalum nitride (TaN), tungsten nitride ($W_2N$), titanium silicon nitride (TiSiN), tantalum silicon nitride (TaSiN).

7. The method of claim 5,
    wherein the source/drain contact is disposed between a first gate structure and a second gate structure,
    wherein the source/drain contact, the first gate structure and the second gate structure are disposed over a fin structure,
    wherein a top surface of the contact feature is lower than the top surfaces of the first spacer and the second spacer.

8. A method, comprising:
    receiving a workpiece that includes:
        a first gate electrode and a second gate electrode,
        a first spacer disposed along a sidewall of the first gate electrode,
        a first gate dielectric capping layer disposed over top surfaces of the first gate electrode and the first spacer,
        a second spacer disposed along a sidewall of the second gate electrode,
        a second gate dielectric capping layer disposed over top surfaces of the second gate electrode and the second spacer,
        a contact feature disposed between the first spacer and the second spacer along a direction,
        a self-aligned contact (SAC) dielectric layer disposed over the first gate dielectric capping layer, the second gate dielectric capping layer, and the contact feature, a portion of the SAC dielectric layer extending between the first spacer and the second spacer as well as between the first gate dielectric capping layer and the second gate dielectric capping layer along the direction, wherein the portion of the SAC dielectric layer is in direct contact with a sidewall of the first gate dielectric capping layer and a sidewall of the second gate dielectric capping layer and a top surface of the SAC dielectric layer is planar, and a first dielectric layer over the SAC dielectric layer;

forming a via opening through the first dielectric layer and the portion of the SAC dielectric layer to expose the contact feature, wherein a portion of the via opening is disposed between a sidewall of the first spacer and a sidewall of the second spacer;

after the forming of the via opening, forming a first reset layer over the exposed contact feature;

after the forming of the first reset layer, selectively depositing a first barrier layer on surfaces of the SAC dielectric layer and the first dielectric layer;

depositing a via metal fill layer in the via opening to couple to the first reset layer;

depositing a second dielectric layer over the via metal fill layer;

forming a trench in the second dielectric layer to expose the via metal fill layer;

after the forming of the trench, forming a second reset layer over the exposed via metal fill layer;

after the forming of the second reset layer, selectively depositing a second barrier layer on surfaces of the second dielectric layer; and depositing a trench metal fill layer over the trench, wherein top surfaces of the first spacer and the second spacer are higher than a top surface of the contact feature.

9. The method of claim 8, wherein the first reset layer and the second reset layer comprise cobalt or ruthenium.

10. The method of claim 8,
wherein the selectively depositing of the first barrier layer comprises:
depositing a first self-assembled monolayer (SAM) layer on the first reset layer, and
after the depositing of the first SAM layer, selectively depositing the first barrier layer on surfaces other than surfaces of the first SAM layer,
wherein the selectively depositing of the first barrier layer comprises use of a precursor,
wherein the precursor has low affinity to the first SAM layer.

11. The method of claim 10,
wherein the first SAM layer comprises a molecule that includes a head group and a tail group,
wherein the head group comprises phosphorus (P), sulfur (S), or silicon (Si) and the tail group comprises a carbon chain.

12. The method of claim 11, wherein the molecule comprises ODPA (Octadecylphosphonic), organosulfurs, dodecanethiol, alkanethiol, or 3-aminopropyl)triethoxysilane (APTES).

13. The method of claim 8,
wherein the selectively depositing of the second barrier layer comprises:
depositing a second self-assembled monolayer (SAM) layer on the second reset layer; and
after the depositing of the second SAM layer, selectively depositing the second barrier layer on surfaces other than surfaces of the second SAM layer,
wherein the selectively depositing of the second barrier layer comprises use of a precursor,
wherein the precursor has low affinity to the second SAM layer.

14. The method of claim 8,
wherein the contact feature comprises a source/drain contact and a source/drain contact capping layer disposed on the source/drain contact,
wherein the forming of the via opening exposes the source/drain contact capping layer.

15. The method of claim 14, wherein the source/drain contact capping layer comprises titanium nitride (TiN), tantalum nitride (TaN), tungsten nitride ($W_2N$), titanium silicon nitride (TiSiN), tantalum silicon nitride (TaSiN).

16. A method comprising:
receiving a workpiece that includes:
a first gate electrode and a second gate electrode,
a first spacer disposed along a sidewall of the first gate electrode,
a first gate dielectric capping layer disposed over top surfaces of the first gate electrode and the first spacer,
a second spacer disposed along a sidewall of the second gate electrode,
a second gate dielectric capping layer disposed over top surfaces of the second gate electrode and the second spacer,
a first contact feature disposed between the first spacer and the second spacer along a direction;
depositing a self-aligned contact (SAC) dielectric layer over the first gate dielectric capping layer, the second gate dielectric capping layer and the first contact feature to provide a planar top surface, wherein the SAC dielectric layer is in direct contact with a sidewall of the first gate dielectric capping layer and a sidewall of the second gate dielectric capping layer;
depositing a first dielectric layer over the planar top surface of the SAC dielectric layer;
forming a via opening and a trench in a second dielectric layer over the first dielectric layer such that a portion of the via opening is disposed between a sidewall of the first spacer and a sidewall of the second spacer;
selectively forming a first barrier layer over sidewalls of the via opening and the trench such that a top surface of the first contact feature is free of the first barrier layer;
depositing a liner within the via opening and the trench; and
depositing a first metal fill layer over the liner.

17. The method of claim 16, wherein the selectively forming of the first barrier layer comprises:
depositing a self-assembled monolayer (SAM) on the first contact feature;
depositing the first barrier layer over sidewalls of the via opening using a precursor; and
performing an anneal to remove the SAM,
wherein the SAM repels the precursor.

18. The method of claim 16, wherein the selectively forming of the first barrier layer comprises:
depositing a reset layer over the first contact feature; and
depositing a self-assembled monolayer (SAM) on the reset layer.

19. The method of claim 16, further comprising:
after the forming of the first barrier layer and before the depositing of the liner, depositing a second metal fill layer over the first contact feature.

20. The method of claim 19, further comprising depositing a second barrier layer over the liner.

* * * * *